US012688343B2

(12) United States Patent
Pesco Alcalde et al.

(10) Patent No.: US 12,688,343 B2
(45) Date of Patent: Jul. 21, 2026

(54) AUTOMATED ARTIFICIAL INTELLIGENCE BASED CIRCUIT AND CIRCUIT BOARD DESIGN

(71) Applicant: CELUS GmbH, Munich (DE)

(72) Inventors: André Pesco Alcalde, Munich (DE); Alexander Pohl, Heldenstein (DE)

(73) Assignee: Celus GmbH, Munich (DE)

( * ) Notice: Subject to any disclaimer, the term of this patent is extended or adjusted under 35 U.S.C. 154(b) by 819 days.

(21) Appl. No.: 18/174,492

(22) Filed: Feb. 24, 2023

(65) Prior Publication Data

US 2024/0020445 A1     Jan. 18, 2024

Related U.S. Application Data

(60) Provisional application No. 63/371,500, filed on Aug. 15, 2022, provisional application No. 63/268,682, filed on Feb. 28, 2022.

(51) Int. Cl.
*G06F 30/31*          (2020.01)
*G06N 20/00*          (2019.01)

(52) U.S. Cl.
CPC ............. *G06F 30/31* (2020.01); *G06N 20/00* (2019.01)

(58) Field of Classification Search
CPC ................................. G06F 30/31; G06N 20/00
USPC ........................................................ 716/139
See application file for complete search history.

(56) References Cited

U.S. PATENT DOCUMENTS

| | | | |
|---|---|---|---|
| 9,268,895 B2 | 2/2016 | Perry et al. | |
| 9,990,455 B1 | 6/2018 | Sinivaara et al. | |
| 10,102,320 B2 | 10/2018 | Pataky | |
| 10,289,788 B1 | 5/2019 | Kumar et al. | |
| 10,437,954 B1 | 10/2019 | White et al. | |
| 10,558,774 B1 | 2/2020 | Kumar et al. | |
| 10,592,704 B2 | 3/2020 | Brookshire | |
| 10,678,973 B2 | 6/2020 | Chuang et al. | |
| 10,699,051 B1 | 6/2020 | Zhang et al. | |
| 10,719,657 B1 | 7/2020 | Feuillette | |
| 10,769,328 B2 | 9/2020 | Chawda et al. | |
| 10,817,634 B2 | 10/2020 | Oh | |
| 11,087,060 B1 | 8/2021 | Zhang et al. | |
| 11,216,605 B2 | 1/2022 | Osburn et al. | |
| 11,366,948 B2 | 6/2022 | Srinivasan et al. | |
| 11,727,020 B2 * | 8/2023 | Bulut ..................... | G06N 3/042 |
| | | | 706/12 |
| 11,775,720 B2 | 10/2023 | Mahmud et al. | |
| 11,790,136 B2 | 10/2023 | Park et al. | |
| 11,836,602 B2 | 12/2023 | Li | |
| 11,836,641 B2 | 12/2023 | Mamidi et al. | |
| 11,900,033 B2 | 2/2024 | Hunter et al. | |
| 12,417,336 B1 * | 9/2025 | Najibi ................... | G06F 30/392 |
| 12,462,083 B1 * | 11/2025 | Fan ....................... | G06F 30/327 |
| 2009/0307638 A1 * | 12/2009 | Mcconaghy ........... | G06F 30/36 |
| | | | 716/100 |

(Continued)

*Primary Examiner* — Suchin Parihar

(74) *Attorney, Agent, or Firm* — Knobbe, Martens, Olson & Bear, LLP

(57)          ABSTRACT

The system receives user-provided input requirements. The system automatically generates solution variants for an electronics hardware system using the user-provided input requirements and artificial intelligence. The system automatically evaluates the solution variants using additional artificial intelligence. The system presents the solution variants and provides visual feedback to engineers to evaluate the solutions based on metrics.

20 Claims, 17 Drawing Sheets

(56)           References Cited

U.S. PATENT DOCUMENTS

| | | | |
|---|---|---|---|
| 2021/0073449 A1* | 3/2021 | Segev | G06F 30/27 |
| 2021/0319327 A1 | 10/2021 | Poirier et al. | |
| 2021/0390243 A1* | 12/2021 | Fischer | G06F 30/27 |
| 2022/0027536 A1 | 1/2022 | Dutta et al. | |
| 2022/0180159 A1 | 6/2022 | Kimura et al. | |
| 2023/0153505 A1 | 5/2023 | Chang et al. | |
| 2023/0153512 A1 | 5/2023 | Shapira et al. | |
| 2024/0126960 A1 | 4/2024 | Peng et al. | |
| 2024/0394451 A1* | 11/2024 | Abbas | G06F 30/27 |
| 2025/0021913 A1* | 1/2025 | Harder | G16H 50/30 |

* cited by examiner

1

AUTOMATED ARTIFICIAL INTELLIGENCE BASED CIRCUIT AND CIRCUIT BOARD DESIGN

INCORPORATION BY REFERENCE TO ANY PRIORITY APPLICATIONS

Any and all applications for which a foreign or domestic priority claim is identified in the Application Data Sheet as filed with the present application are hereby incorporated by reference under 37 CFR 1.57.

This application claims benefit of U.S. Provisional Patent Application Ser. No. 63/268,682 entitled "SYSTEM AND METHOD FOR CONFIGURING CIRCUITS AND CIR- CUIT BOARDS FOR MANUFACTURE" filed Feb. 28, 2022, and U.S. Provisional Patent Application Ser. No. 63/371,500, entitled "SYSTEMS AND METHODS FOR AUTOMATED ELECTRONICS DESIGN AND GRAPHI- CAL USER INTERFACE" filed Aug. 15, 2022, which are hereby incorporated by reference in their entireties.

BACKGROUND

Electronic components can be mounted on circuit boards. Conductive tracks, included in a circuits board, can be configured to interconnect the electronic components on the circuit board. The electronic circuit boards may be manu- factured from materials, such as, but not limited to, laminate, fiberglass resin composite, or ceramic. The design of elec- tronic circuits and electronic boards is a technical engineer- ing process typically requiring a team of engineers.

SUMMARY

The systems, methods, and devices described herein each have several aspects, no single one of which is solely responsible for its desirable attributes. Without limiting the scope of this disclosure, several non-limiting features will now be discussed briefly.

According to an embodiment, a computer-implemented method is disclosed for automated electronics design, the computer-implemented method comprising: under control of a computer hardware processor configured with computer executable instructions, receiving a design specification, the design specification comprising a plurality of blocks and a first connection, wherein the first connection connects a first block and a second block; determining a set of ranges for a first key performance indicator, the set of ranges comprising a first range and a second range; applying an artificial intelligence algorithm based on the design specification, wherein the artificial intelligence algorithm outputs an infer- ence; generating a plurality of solution variants based on the inference, wherein generating the plurality of solution vari- ants comprises: for each range of the set of ranges, for each block of the plurality of blocks, determining query param- eters based on block, executing a query of a database with the query parameters, receiving, from the database, a plu- rality of results responsive to the query, wherein each result of the plurality of results is associated with a hardware component, identifying, from the plurality of results, a subset of hardware components for the block, determining a ranking for the subset of hardware components based on the range, and selecting, from the subset of hardware compo- nents, a hardware component based on the ranking; and presenting the plurality of solution variants in a graphical user interface.

2

According to an aspect, applying the artificial intelligence algorithm may further comprise: applying a machine learn- ing model based on the design specification, wherein the machine learning model outputs a predicted category, the inference comprising the predicted category, wherein deter- mining the ranking for the subset of hardware components further comprises: adjusting the ranking of hardware com- ponents from the subset of hardware components that are associated with the predicted category.

According to an aspect, the computer-implemented method may further comprise: determining training data comprising a plurality of design specifications and a label for each design specification from the plurality of design specifications; and training the machine learning model using the training data, wherein training the machined learning model comprises adjusting a weight of the machine learning model based on labels associated with the plurality of design specifications.

According to an aspect, applying the artificial intelligence algorithm may further comprise: applying a heuristic based on the design specification, wherein the heuristic identifies the first block from the plurality of blocks, wherein gener- ating the plurality of solution variants further comprises: causes the first block to be processed before other blocks from the plurality of blocks.

According to an aspect, applying the heuristic may further comprise: determining, from the design specification, that the first block has more connections than the second block.

According to an aspect, presenting the plurality of solu- tion variants in the graphical user interface may comprise: presenting, in the graphical user interface, a first graph associated with the first key performance indicator, wherein each solution variant from the plurality of solution variants is associated with a first point on the first graph; and presenting, in the graphical user interface, a second graph associated with a second key performance indicator, wherein each solution variant from the plurality of solution variants is associated with a second point on the second graph.

According to an embodiment, a system is disclosed com- prising: a data storage medium comprising a database, wherein the database comprises a plurality of hardware components; and one or more computer hardware processors in communication with the data storage medium, wherein the one or more computer hardware processors are config- ured to execute computer-executable instructions to at least: receive a design specification, the design specification com- prising a plurality of blocks and a first connection, wherein the first connection connects a first block and a second block; determine a set of ranges for a key performance indicator, the set of ranges comprising a first range and a second range; generate a plurality of solution variants based on the design specification, wherein generating the plurality of solution variants comprises: for each range of the set of ranges, for each block of the plurality of blocks, determine query parameters based on the block, execute a query of the database with the query parameters, receive, from the data- base, a plurality of results responsive to the query, wherein each result of the plurality of results is associated with a hardware component, apply an artificial intelligence algo- rithm to one or more hardware components from the plu- rality of results and the range, wherein the artificial intelli- gence algorithm outputs an inference, and select, from the plurality of results, a hardware component based on the inference; and present the plurality of solution variants in a graphical user interface.

According to an aspect, the one or more computer hard- ware processors may be configured to execute further computer-executable instructions to at least: determine a first key performance indicator associated with a first solution variant of the plurality of solution variants, wherein presenting the plurality of solution variants comprises: presenting the first key performance indicator in the graphical user interface.

According to an aspect, the first key performance indicator may comprise at least one of an estimated project cost, area, component availability, maturity, or reliability.

According to an aspect, determining the first key performance indicator may comprise: determining that an area rule applies to the first solution variant; and calculating the first key performance indicator, wherein calculating the first key performance indicator comprises: applying a first coefficient to an initial area of the first solution variant.

According to an aspect, determining the first key performance indicator may comprise: applying a machine learning model based on the first solution variant, wherein the machine learning model outputs a model result; and calculating the first key performance indicator based on the model result.

According to an aspect, the one or more computer hardware processors may be configured to execute additional computer-executable instructions to at least: determine training data comprising a plurality of solutions and a label for each solution from the plurality of solutions; and train the machine learning model using the training data, wherein training the machined learning model comprises adjusting a weight of the machine learning model based on labels associated with the plurality of solutions.

According to an aspect, applying the artificial intelligence algorithm to the one or more hardware components may further comprise: executing a simulated annealing algorithm on the one or more hardware components, wherein the simulated annealing algorithm generates a candidate solution as the inference.

According to an embodiment, a system is disclosed comprising: a data storage medium comprising a database, wherein the database comprises a plurality of hardware components; and one or more computer hardware processors in communication with the data storage medium, wherein the one or more computer hardware processors are configured to execute computer-executable instructions to at least: receive a design specification, the design specification comprising a plurality of blocks and a first connection, wherein the first connection connects a first block and a second block; determine a plurality of input seeds; generate a plurality of solution variants based on the design specification, wherein generating the plurality of solution variants comprises: for each input seed of the plurality of input seeds, for each block of the plurality of blocks, determine query parameters based on the block, executing a query of the database with the query parameters, receive, from the database, a plurality of results responsive to the query, wherein each result of the plurality of results is associated with a hardware component, apply an artificial intelligence algorithm to one or more hardware components from the plurality of results and the input seed, wherein the artificial intelligence algorithm outputs an inference, and select, from the plurality of results, a hardware component based on the inference; and present the plurality of solution variants in a graphical user interface.

According to an aspect, the one or more computer hardware processors may be configured to execute further computer-executable instructions to at least: determine a first key performance indicator associated with a first solution variant of the plurality of solution variants, wherein presenting the plurality of solution variants comprises: presenting the first key performance indicator in the graphical user interface.

According to an aspect, determining the first key performance indicator may comprise: combining a cost for each hardware component of the first solution variant into a total cost, wherein the first key performance indicator comprises the total cost.

According to an aspect, determining the first key performance indicator may comprise: determining an estimated level of availability for each hardware component of the first solution variant; and determining a combined level of availability from each estimated level of availability, wherein the first key performance indicator comprises the combined level of availability.

According to an aspect, determining the first key performance indicator may comprise: determining an estimated level of reliability for each hardware component of the first solution variant; and determining a combined level of reliability from each estimated level of reliability, wherein the first key performance indicator comprises the combined level of reliability.

According to an aspect, determining the plurality of input seeds may comprise: pseudo-randomly generating a first number, wherein a first input seed of the plurality of input seeds comprises the first number.

According to an aspect, applying the artificial intelligence algorithm to the one or more hardware components may further comprise: executing a simulated annealing algorithm on the one or more hardware components using the first number, wherein the simulated annealing algorithm generates a candidate solution as the inference.

According to an embodiment, an apparatus is disclosed for configuring circuits and corresponding circuit boards for manufacture, wherein the apparatus includes computing hardware provided with a graphical user interface, wherein the apparatus is configured in use to execute software, wherein the apparatus is configured: (i) to receive input data from a user via the graphical user interface, wherein the input data includes one or more parameters defining a circuit design task; (ii) to generate a plurality of solutions to the circuit design task, and to generate via the graphical user interface one or more graphical representations of the plurality of solutions as a function of one or more KPIs included in the input data; (iii) to provide the user with a filter via the graphical user interface to include in or exclude from the graphical representations any generated solutions satisfying one or more user-specified criteria, the filtering resulting in a subset of the plurality of solutions; and (iv) to generate, based on the subset, one or more designs of circuits and corresponding circuit boards.

According to an aspect, the software, when executed on the computing hardware, executes one or more algorithms that may be configured to provide an evaluation based on at least one of: (i) artificial intelligence (AI) neural network-based analysis; (ii) rule-based analysis; (iii) library examples of earlier related types of design projects; and (iv) catalog lists of circuit component parts generated by component manufacturers, wherein the evaluation is used to generate the plurality of solutions.

According to an aspect, the software, when in use, may be configured to apply the filter iteratively according to user inputs to generate the subset of the plurality of solutions.

According to an aspect, at least some access to at least a portion of the computing hardware may be available to the user via the Internet.

According to an aspect, at least some access to at least a portion of the computing hardware may be available via the graphical user interface, and wherein the graphical user interface is accessible by the user via a web browser.

According to an aspect, the computing hardware may be spatially local to the user, and the software is provided as downloadable software.

In various aspects, systems and/or computer systems are disclosed that comprise a computer readable storage medium having program instructions embodied therewith, and one or more processors configured to execute the program instructions to cause the one or more processors to perform operations comprising one or more of the above-and/or below-aspects (including one or more aspects of the appended claims).

In various aspects, computer-implemented methods are disclosed in which, by one or more processors executing program instructions, one or more of the above- and/or below-described aspects (including one or more aspects of the appended claims) are implemented and/or performed.

DETAILED DESCRIPTION

Figure 1:
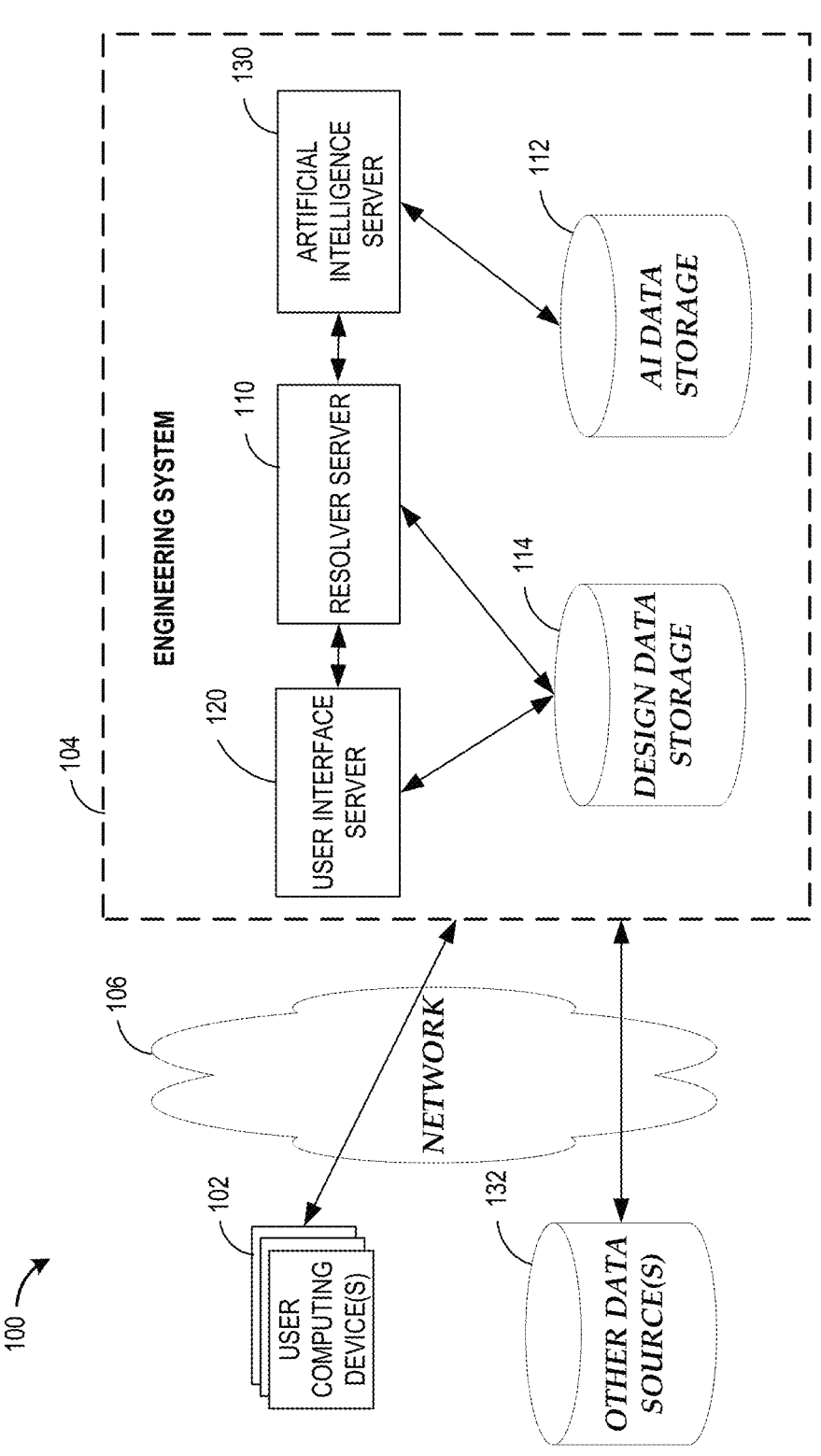
FIG. 1 is a block diagram depicting an illustrative network environment for implementing an engineering system.

As described above, the design of electronic hardware systems is a technical engineering process. In particular, the development of design files is usually performed through the usage of computers and appropriate Engineering Design Automation (EDA) software tools, where the engineer can manually create drawings that logically represent the electronic hardware systems, commonly referred to as "schematics," "schematic files," or "diagrams," and mechanical drawings of the physical implementation of such systems, commonly referred to as a "layout" of the design.

Software-based platforms for designing circuits and associated electronic circuit boards allow for designing configurations of electronic components to be mounted on circuit boards and for designing configurations of conductive tracks included on the circuits boards for interconnecting the electronic components. The software-based platforms can present a graphical user interface for receiving input parameters from users for guiding designs of the electronic circuit boards and for presenting representations of the circuit boards for the users to inspect. The designs are then used to manufacture the electronic circuit boards and populate them with corresponding electronic components. The electronic circuit boards are usually manufactured from laminate, from fiberglass resin composite, from ceramic materials, or similar materials.

A task of designing a given electronic circuit and a given corresponding electronic circuit board may include producing drawings or other design files for use in manufacturing the given corresponding circuit board. The circuit boards may be configured to fulfill certain functional and/or performance requirements. For example, a design of high-speed digital and microwave circuit boards may require consideration of earth planes, signal propagation delays along circuit board tracks, and standing wave ration (SWR) track length matching. In addition, electronic circuit boards may also be required to comply with physical size constraints relating to a casing or enclosure in which they are to be mounted. A circuit board can be designed to fulfill a customer order and satisfy certain customer requirements.

A method for implementing an electronic circuit design project may include a first step of receiving a set of requirements (such as from a customer), and definitions of functional performance. A second step of the method may include generating designs of the electronic circuit complying with the received set of requirements and definitions of functional performance. A third step may include producing the electronic circuit according to designs generated in the second step.

Before commencing to create such schematics and layout drawings for a given project, engineers usually need to consider which components will be necessary when implementing the project to meet certain functional and/or performance requirements for the project to be achieved and/or be successful. On account of their cost-effectiveness, off-the-shelf components may be a first choice of engineers and custom-made components may be prohibitively expensive for certain projects where costs are a driving factor.

Given that the universe of electronic components may consist of millions or billions of parts, humans searching for parts and comparing their technical specifications from documentation (which can include searching or comparing is performed in a manner that is at least largely non-automated) may address only a very small fraction of all the design possibilities. It is highly unlikely that an engineer or team of engineers following such a largely non-automated process would end up with an optimal or even near-optimal solution for their design. Moreover, such a process is a huge cognitive processing task for engineers. Furthermore, for each component to be selected to achieve one or more specified functionalities, such functionalities increase the true search space for engineers by several orders of magnitude, thereby making it extremely unlikely to find a true optimal or even near-optimal selection of components within a reasonable project schedule timescale.

Engineers may use online search engines available on the Internet to select components. The search engines may be made available by circuit component distributors or organizations that create databases of electronic components from multiple distributors. The online search engines may offer parametric searches that do not take into account contextual project information and/or project constraints. Such searches usually only operate at a single component level. But circuits typically have multiple components. For example, a range of 5 to 25 components is common. In such situations, such online search engines are of negligible help. Engineers are often forced to perform trade-off analyses using simple calculation tools, such as by using a spreadsheet application.

A project can have numerous design variants, with each variant representing choices in, for example, one or more of: number of components, types of components, manufacturer of components, properties of components (e.g., resistance, voltage), physical arrangement of components, logical arrangement of components, shape of the minimum perimeter of the board, and area of the board. Engineers may evaluate whether an identified design variant meets certain design targets; moreover, engineers may, in a substantially non-automated manner, calculate values such as total cost and circuit-board area based on information available for each component.

Aspects of the systems and methods described herein may address the foregoing technical problems faced by engineers. The systems and methods described herein may address the challenges engineers face while evaluating a large set of design variants and selecting topologies and/or components to fulfill a set of functional specifications and achieve design targets, such as cost and/or board area. The system may present a graphical user interface and visual feedback to engineers regarding key performance indicator(s) (which can be referred to as parameters). The system can allow a user to select the most appropriate design variant(s) to satisfy targets for key performance indicator(s).

The systems and methods described herein may improve automated electronics design technology. The solutions described herein may address the technical challenges of generating design variants, where each design variant includes a set of hardware components. Generation of design variants can be a problem within the combinatorial optimization field. In a project block diagram with twenty-five blocks (which can be a small to middle complexity level), considering ten solutions for each block renders a solution space with $10^{25}$ combination possibilities. The solutions described herein can advantageously reduce the search space by reducing the potential solutions for each block, such as potential three solutions per block. Therefore, the solutions described herein can reduce the computational set from $10^{25}$ combination possibilities to $3^{25}$ combination possibilities, which is a reduction in combinations by thirteen orders of magnitude. The problem of selecting a set of electronic components, as described herein, may be a non-deterministic polynomial-time hard or NP-hard problem and may not be able to be solved in polynomial time. A naive algorithm would be a complete space search—to search all possible configurations until a minimum or maximum is found. However, the problems described herein may result in such brute force algorithms to run in O(n!). Therefore, even with substantial computing power, traditional optimization algorithms (such as algorithms for solving the problem of finding a best solution from all feasible solutions or feasible solutions from many permutations of options) for selecting a set of hardware components can take hours or days to complete due to the vast number of possible combinations. The technical solutions described herein can enable the algorithms to complete in seconds, such as by reducing the number of intermediary search options. The systems and methods described herein for improved algorithms can enable computers to compute hardware recommendations faster than traditional algorithms and/or use less computing resources (such as using less memory). Therefore, the systems and methods described herein can improve the operation of computer hardware processors.

The systems and methods described herein allow users to visualize how particular key performance indicators may vary among design variants. This may allow a user to immediately identify the trade-offs and/or relationships between the key performance indicators. For example, if a range is selected for a first key performance indicator, that can immediately change the available ranges for a second key performance indicator, and vice versa. The key performance indicators may be displayed in the form of two-, three-, or n-dimensional visualizations (such as graphs or plots), where each design variant may be represented in the visualization (such as a point in a graph), and users can immediately analyze which variants deliver the appropriate key performance indicator(s) to meet design targets, quickly identifying the optimal or near-optimal solutions for their engineering problem. If no solution meets the design requirements, users can use the system to modify the electronic hardware system architecture and re-evaluate the key performance indicators in a matter of minutes or hours, not months.

The systems and methods described herein for providing graphical user interfaces and improving the design process can include some or all of the following features. The graphical user interface may be interactive and may include visualizations for the user. The graphical user interface may be made available via a web browser application, a desktop application, and/or a mobile application. The systems and methods described herein may include algorithms to evaluate design variants based on a database of components, topologies, and/or the definition of the target architecture in the form of a block diagram, which may include one or more technical parameters. The system may provide a selectable set of design targets in the form of key performance indicators, such as, but not limited to, overall project cost, area, component availability, component or topology maturity, and/or predicted or actual reliability. The graphical user interface may also include visualizations.

Figure 2A:
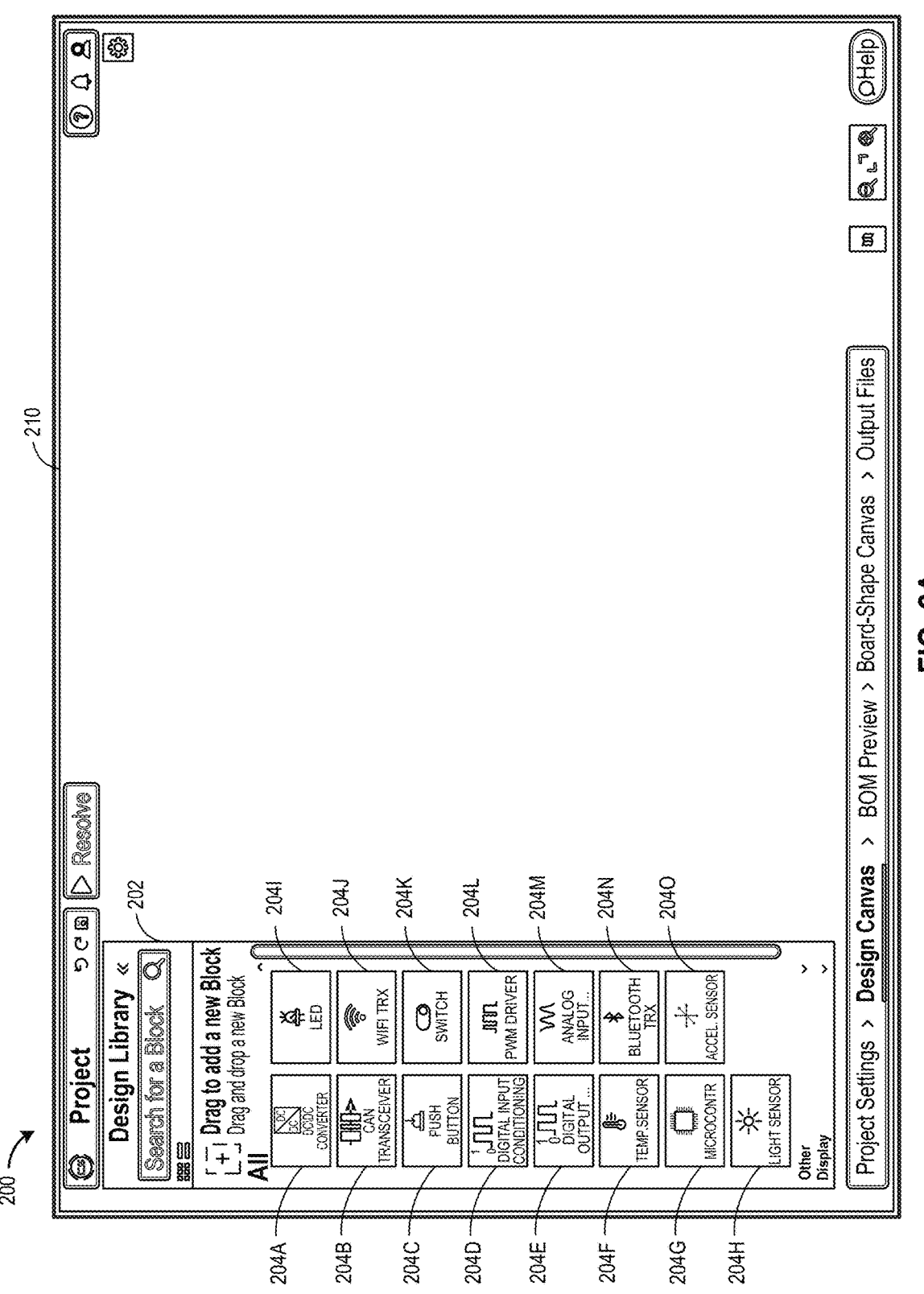
FIGS. 2A-2L depict graphical user interfaces for designing electronic hardware systems.
Figure 2B:
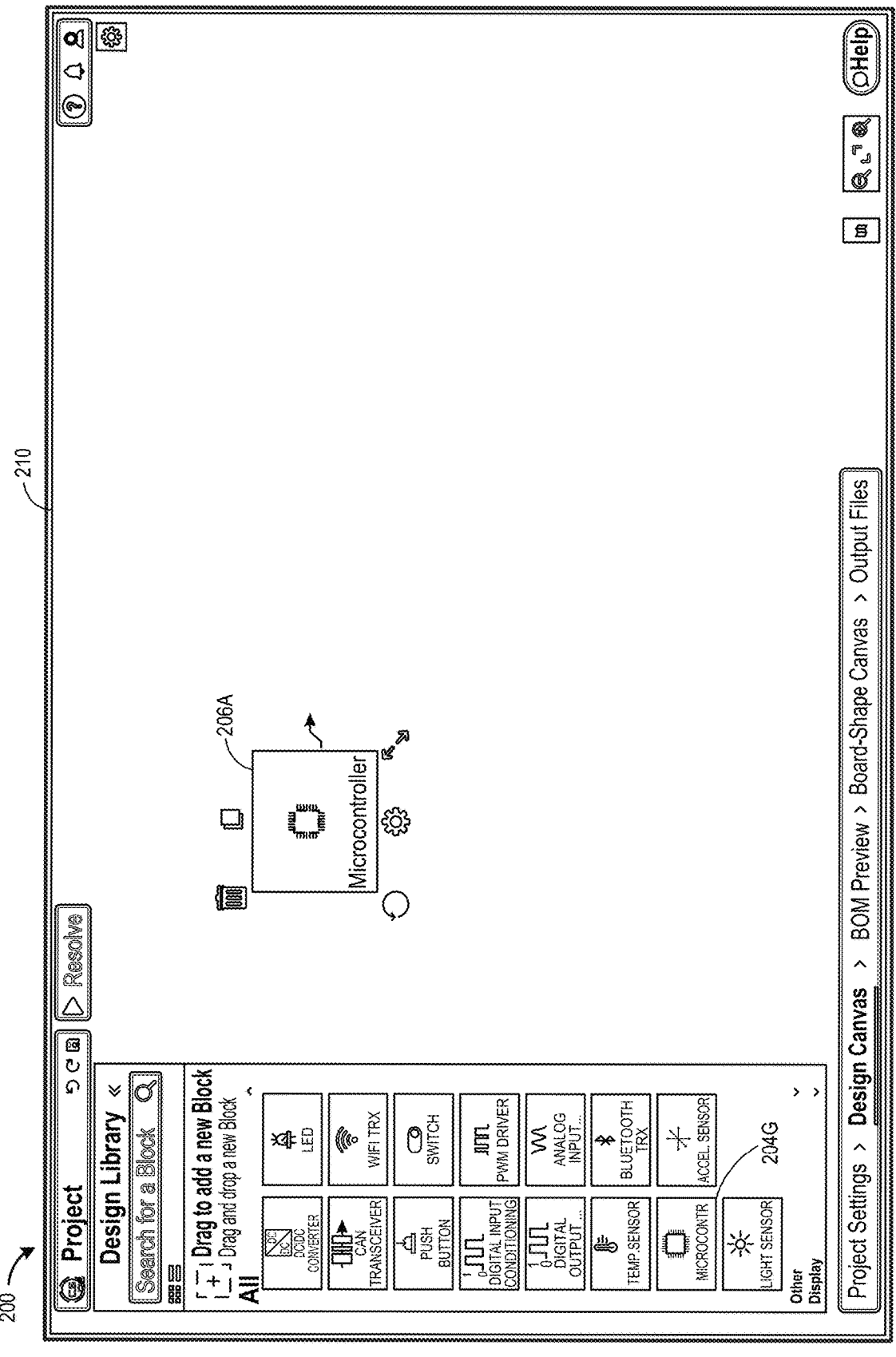
Figure 2C:
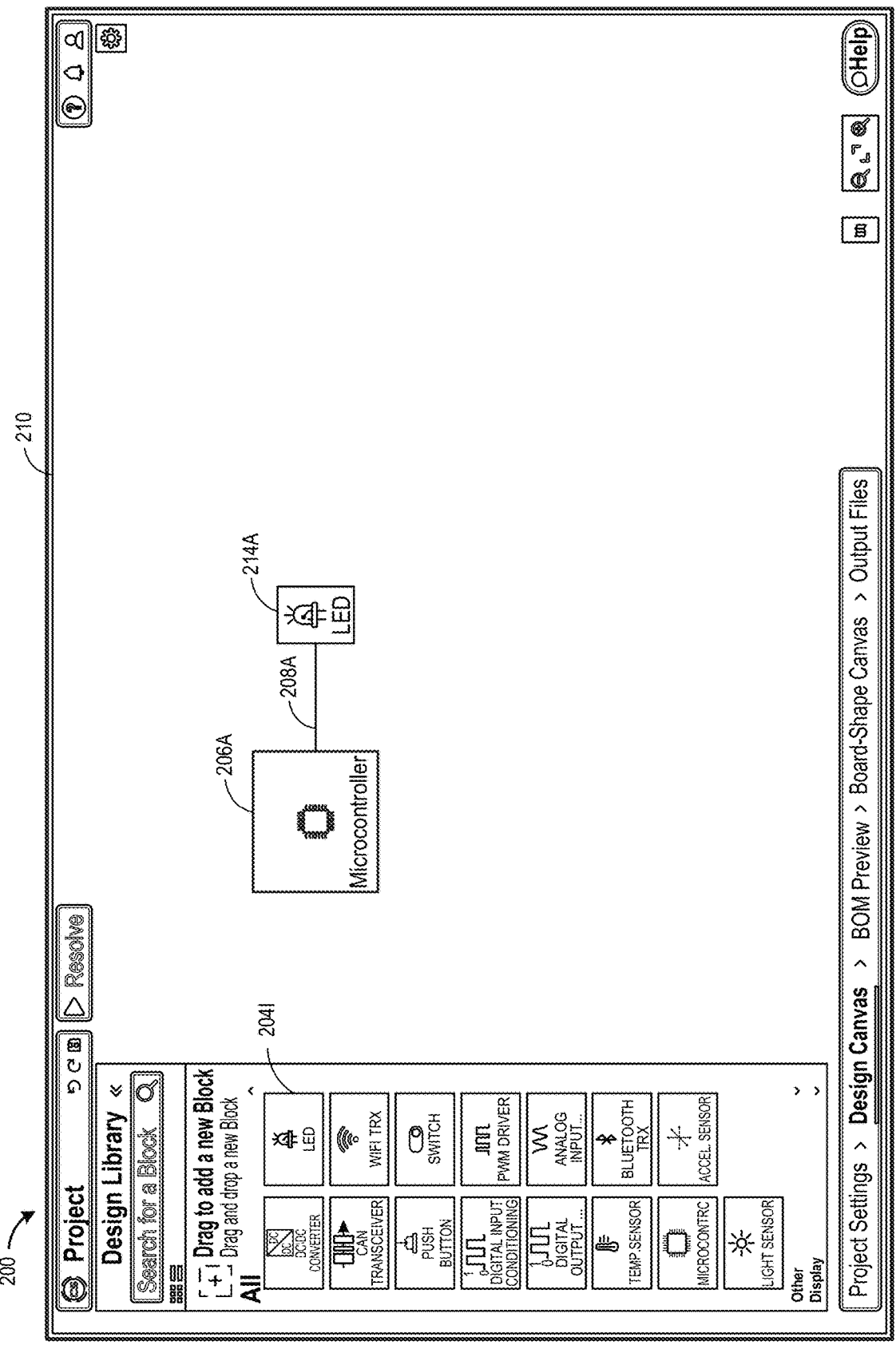
Figure 2D:
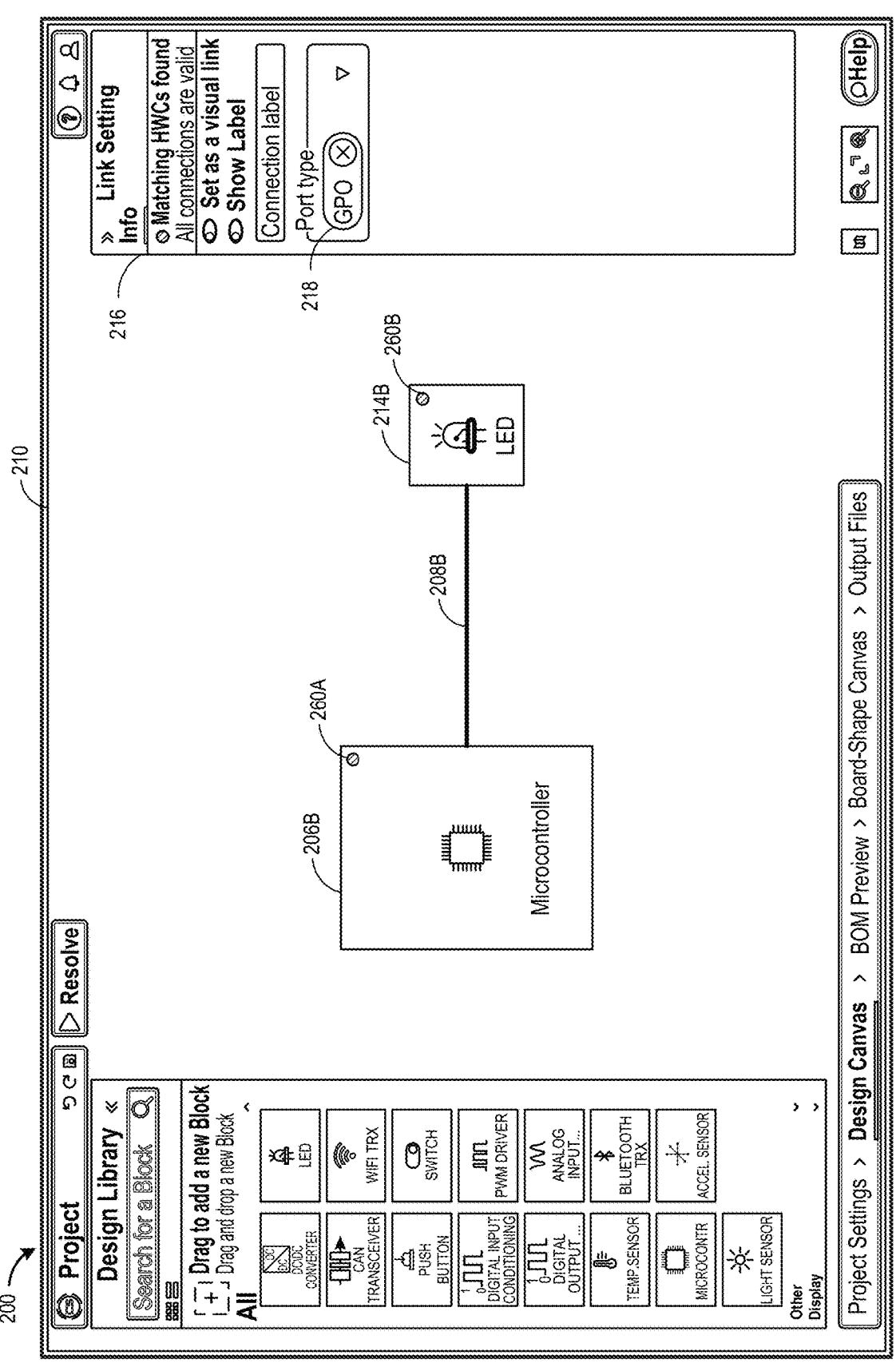
Figure 2E:
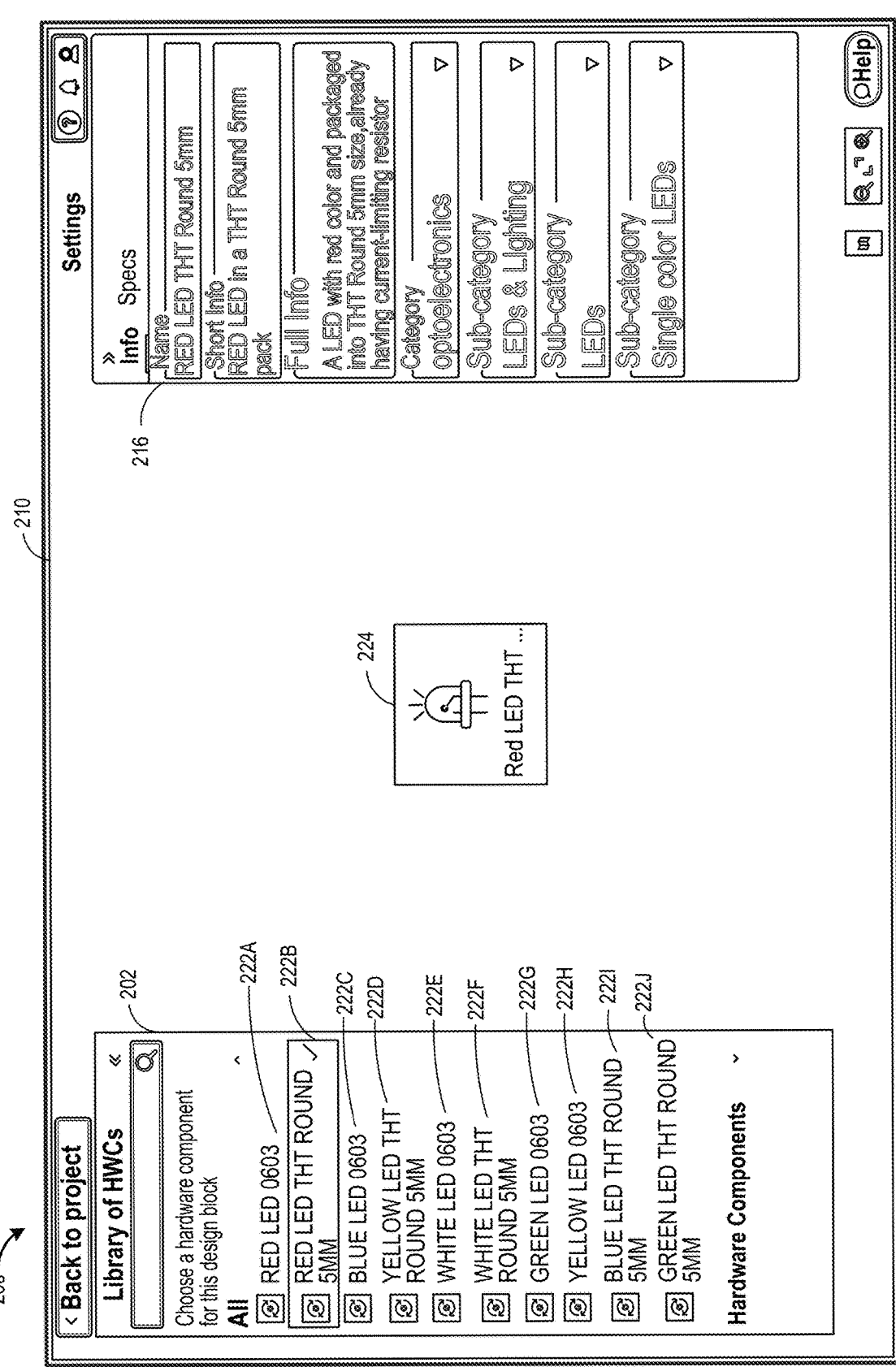
Figure 2F:
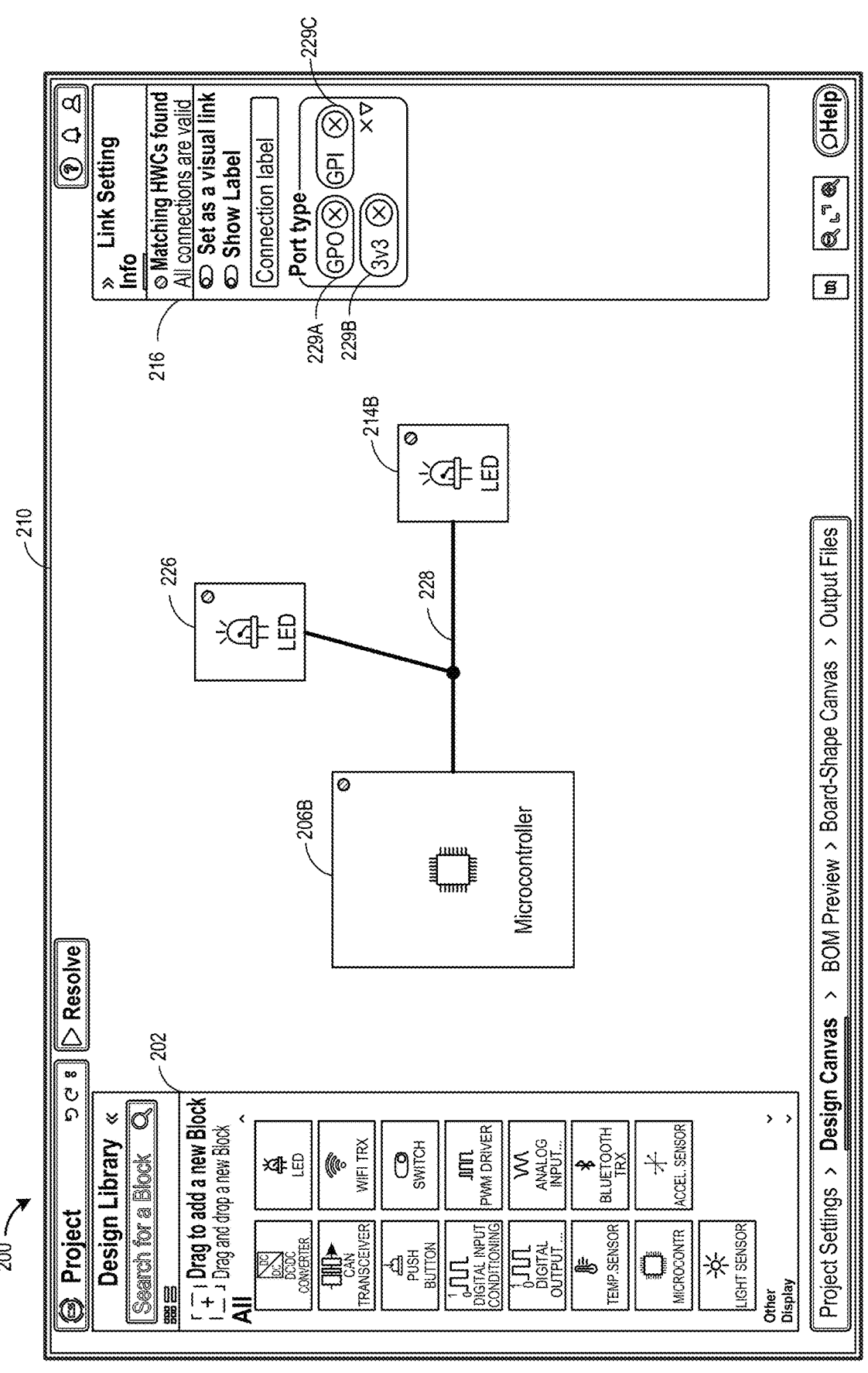
Figure 2G:
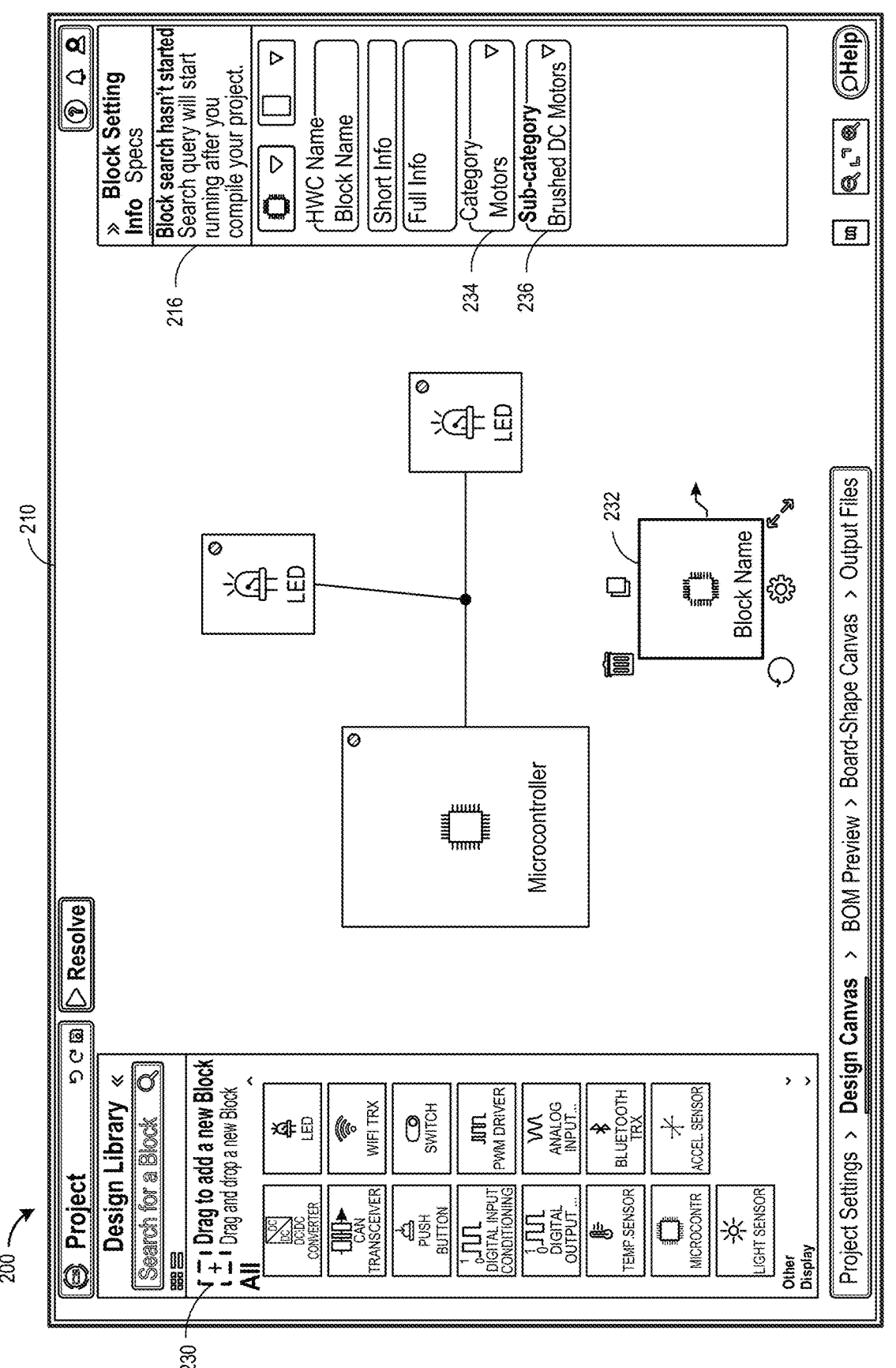
Figure 2H:
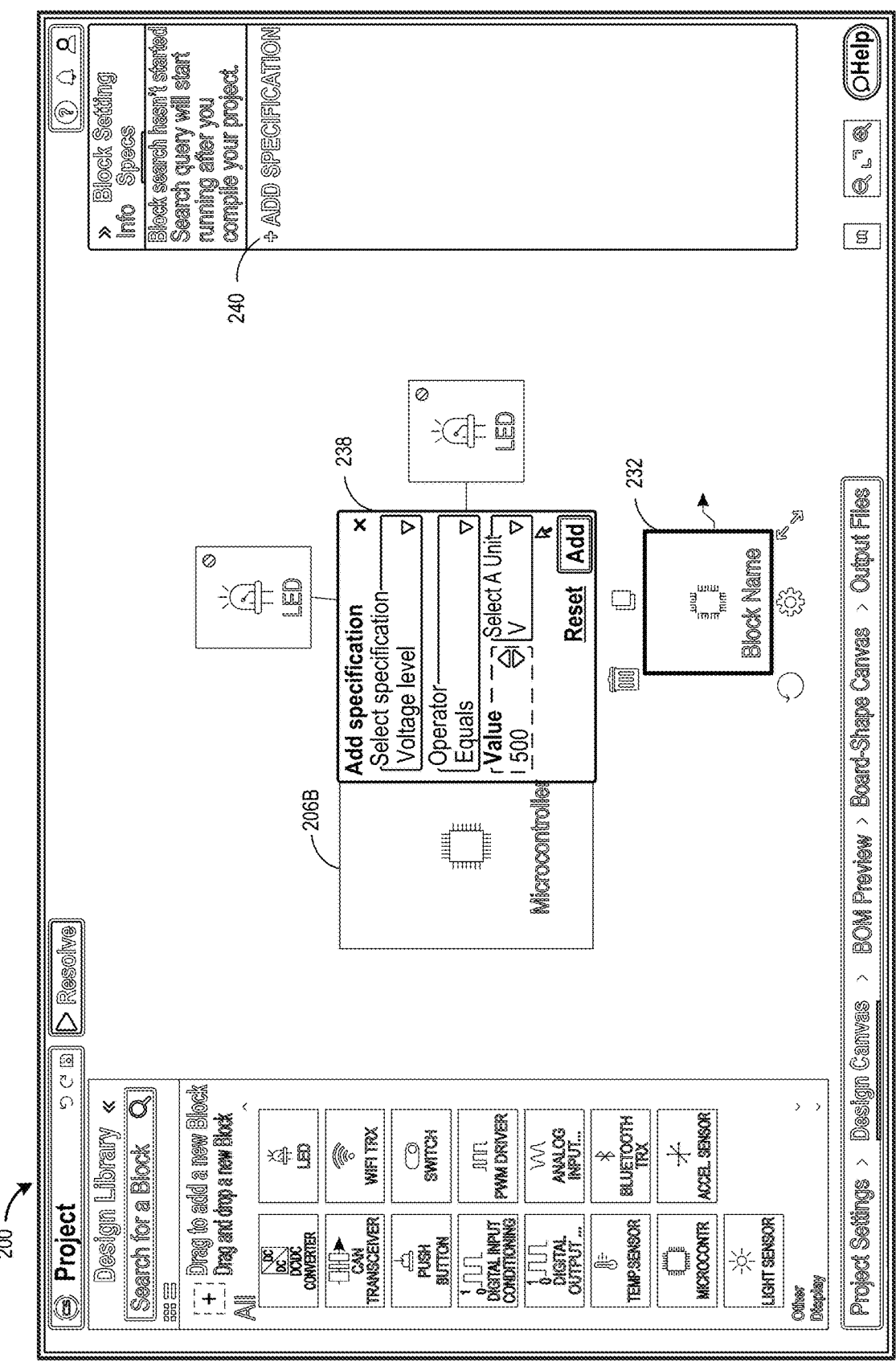
Figure 2I:
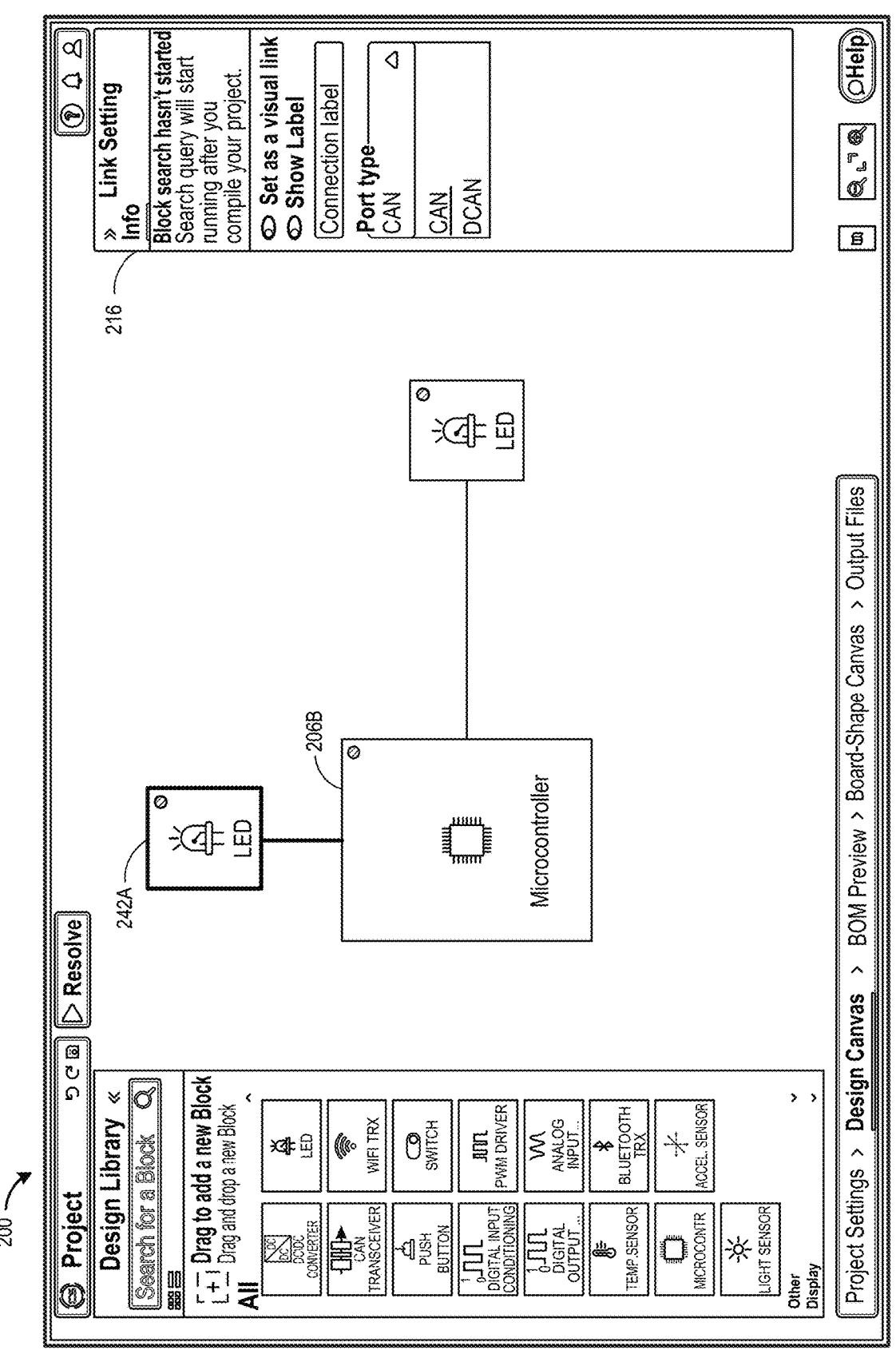
Figure 2J:
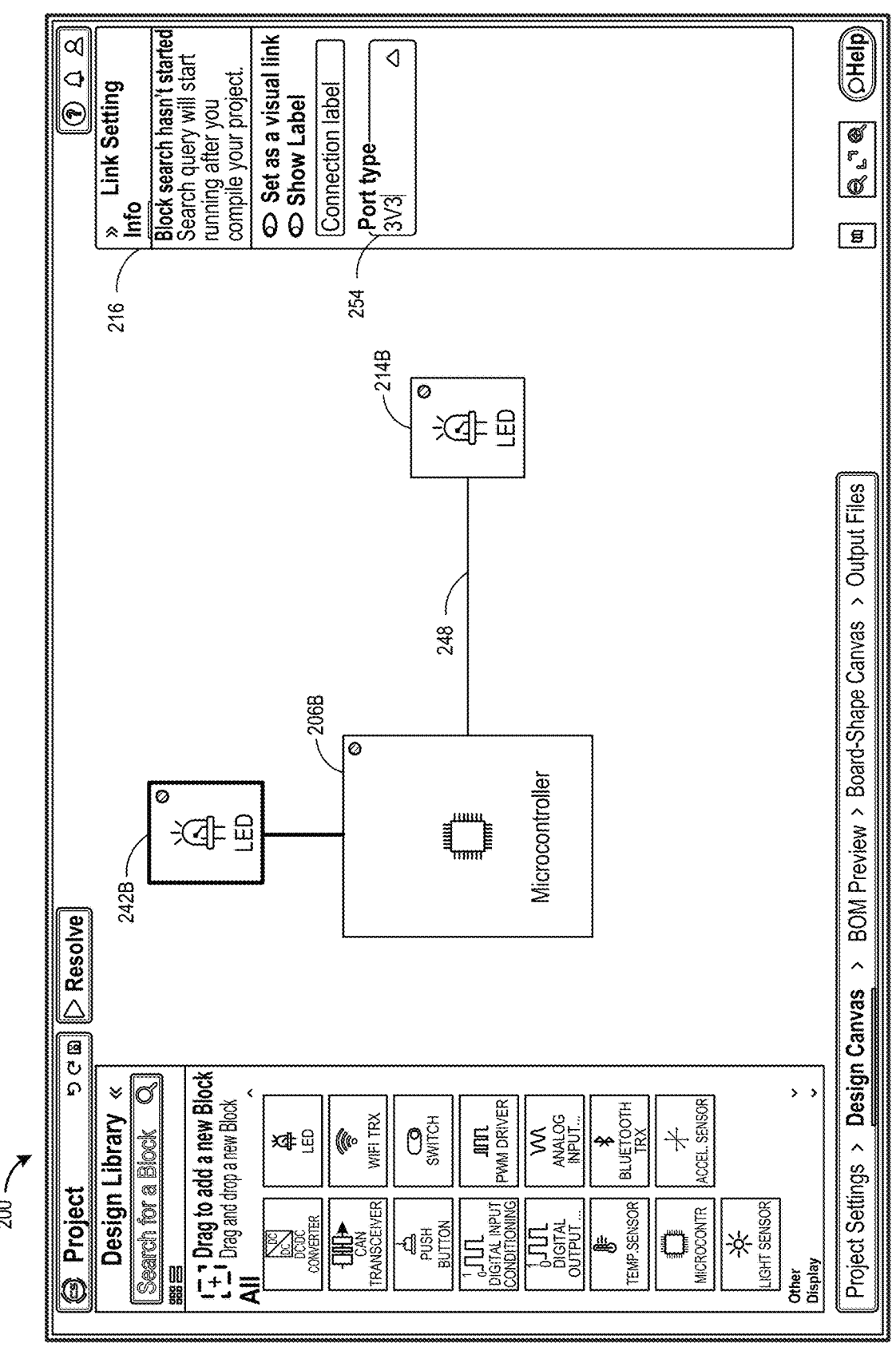
Figure 2K:
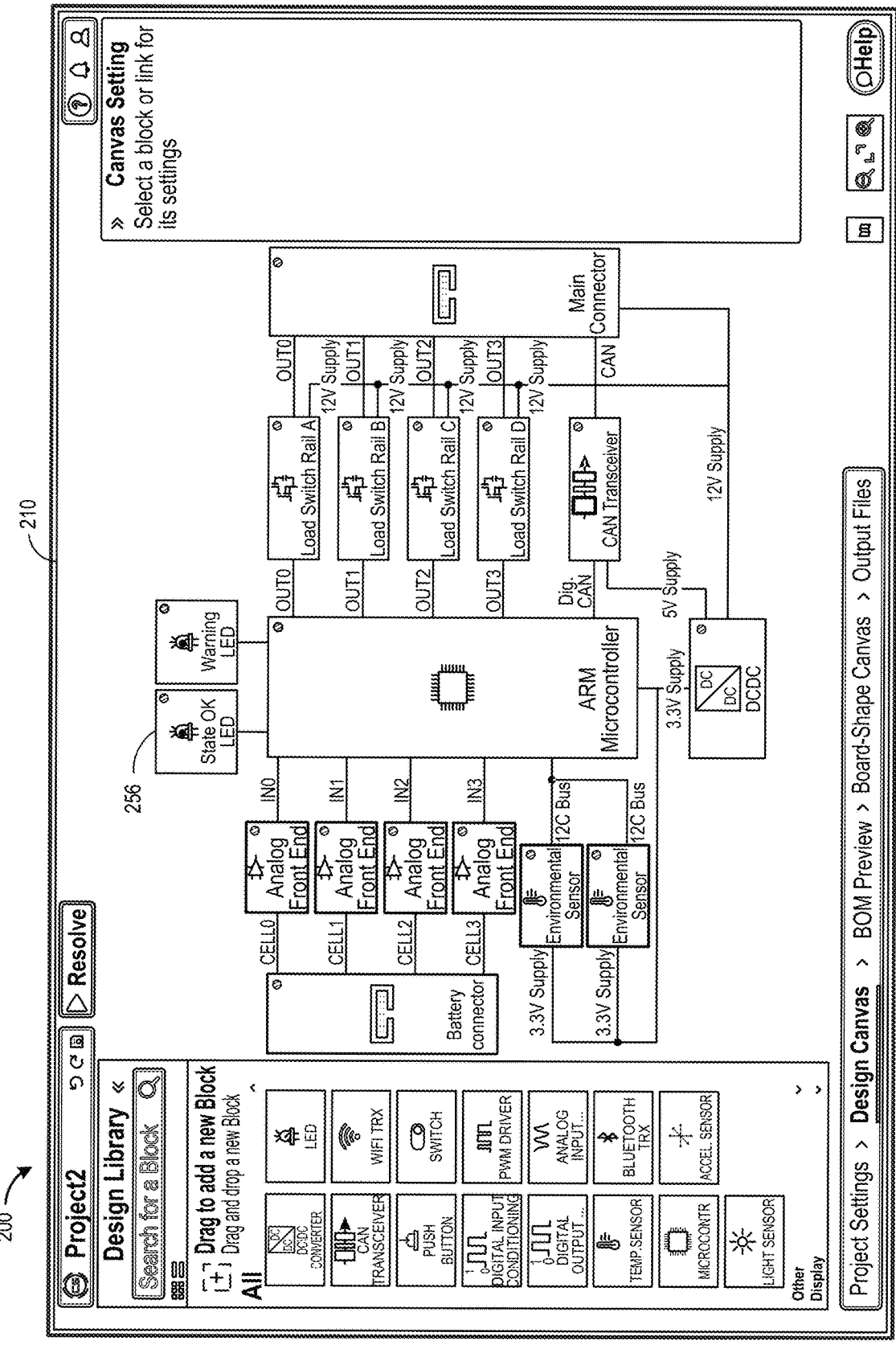
Figure 2L:
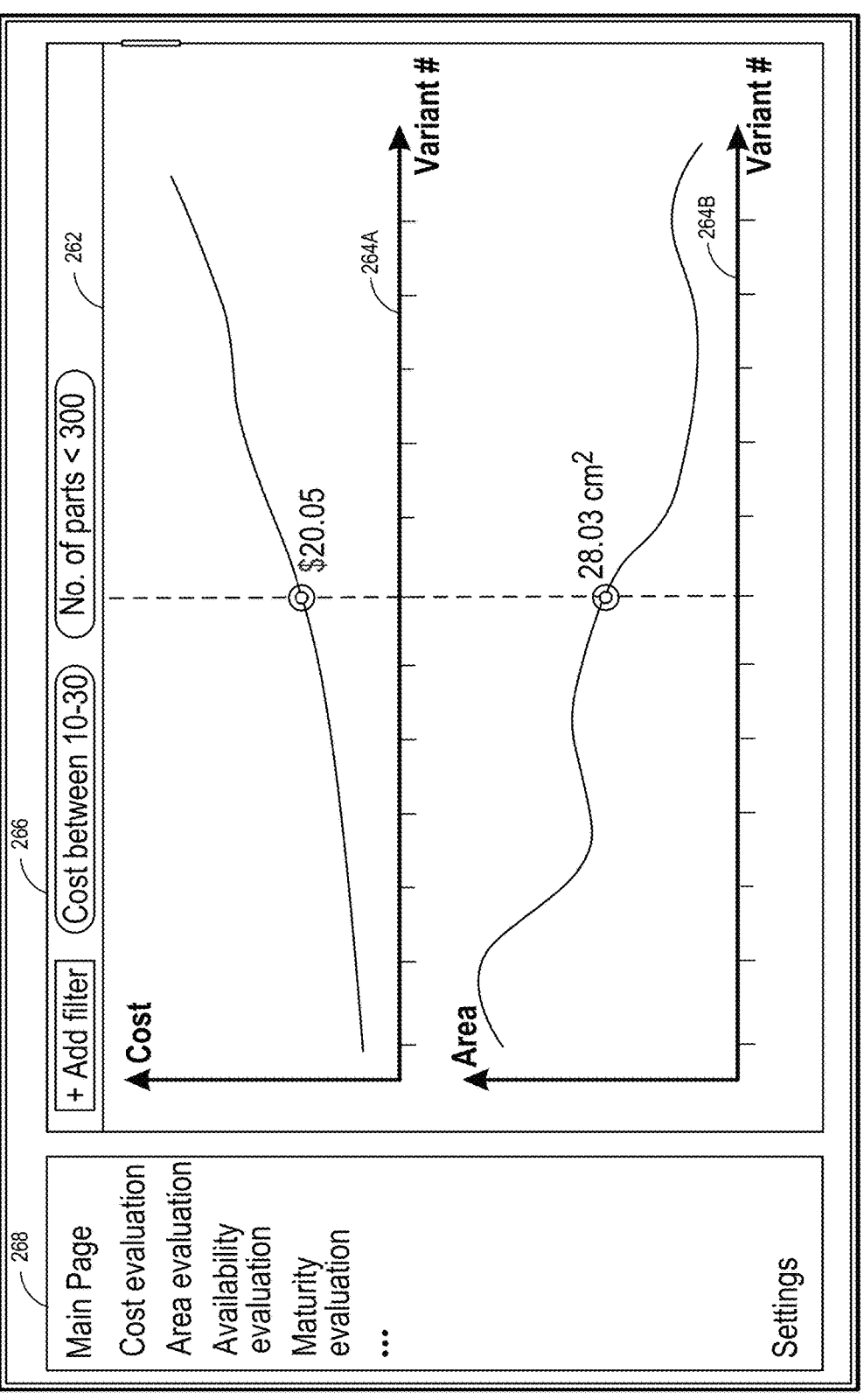

A visualization may include one or more visual plots (as shown in FIG. 2L), representing on one axis the different design variants and one or more key performance indicators on the other axis, that are generated based on the evaluation performed by the system. The graphical user interface may include filters to exclude design variants from the visualizations by applying several parameters, such as, but not limited to, a cost window and/or a maximum number of components. The system may also provide reports related to the selected design variants, in order to provide more information to the user regarding the selected variant. The one or more system algorithms may be configured to provide an evaluation based on at least one of: (i) machine-learning-based analysis (such as a neural-network-based analysis); (ii) rule-based analysis; (iii) a library of examples of earlier related types of design projects; (iv) a catalog of circuit component parts generated by component manufacturers; (v) analytical calculations, such as calculations based on mathematical functions (such as physics calculations) and/or statistical calculations; and/or (vi) heuristics.

In some embodiments, the systems described herein (such as those that provide graphical user interfaces) may be made available via downloadable and/or installable software. The databases described herein, such as a database of components, may be made available to the installed software via a periodic or ad-hoc local synchronization process. Thus, in some embodiments, the systems described herein may have an "offline" mode where access to the Internet or a network database is not necessary for the system to operate.

Turning to FIG. 1, an illustrative network environment 100 is shown in which an engineering system 104 may automatically generate electronics designs. The network environment 100 may include one or more user computing devices 102, the engineering system 104, and other data source(s) 132. The engineering system 104 may include a user interface server 120, a resolver server 110, an artificial intelligence server 130, a design data storage 114, and an artificial intelligence data storage 112. The constituents of the network environment 100 may be in communication with each other either locally or over a network 106.

User computing devices 102 can include, but are not limited to, a laptop, a tablet computer, a personal computer, and/or a smartphone. The user interface server 120 can provide a user interface. A user can provide, via the user computing device 102 and the user interface, requirements for an electronics design, which can include an electronics diagram. The input requirements can include, but are not limited to, connections between blocks and/or the port types for the connections between the blocks. The engineering system 104 can use the design data to automatically search for and identify hardware components that satisfy the input requirements. As described herein, the user interface server 120 can provide a user interface showing design variants.

The engineering system 104 can receive input requirements from sources other than the user computing device 102, such as, but not limited to, the other data source(s) 132. The engineering system 104 can receive input requirements from an external API. The engineering system 104 can receive input requirements via a data feed with the other data source(s) 132. The engineering system 104 can receive input requirements via scraping data from the data source(s) 132. The other data source(s) 132 can be an external database. The other data source(s) 132 may include electronics hardware design data, such as requirements for blocks, connections, and/or hardware components.

The resolver server 110 can be configured to execute a resolver service. The resolver service can execute an algorithm to automatically generate design variants. The resolver service can query, rank, and select hardware components that are compatible with the input requirements. The resolver service can communicate with an artificial intelligence service executed by the artificial intelligence server 130. In some embodiments, the resolver server 110 can communicate with the user interface server 120 to receive the input requirements. The resolver server 110 can communicate with and query the design data storage 114. In some embodiments, the resolver server 110 can provide the selected hardware components to the user interface server 120.

The artificial intelligence server 130 can be configured to execute an artificial intelligence service. The artificial intelligence service can execute algorithm(s) to output inferences based on the input requirements. The resolver service can automatically generate designs based on the inferences from the artificial intelligence service. For example, the artificial intelligence service can infer a project category (such as an automotive project category) from the input requirements and the resolver service can use the project category to automatically select hardware components that are higher ranked for that project category. In some embodiments, the artificial intelligence service can use machine learning models, such as, but not limited to, decision trees, classification models, clustering models, deep-learning models, neural networks, encoder-decoder models, and/or transformer models. The artificial intelligence service can train machine learning models using training data from the artificial intelligence data storage 112. Additionally or alternatively, the artificial intelligence service can use artificial intelligence algorithms other than machine learning algorithms, such as, but not limited to, optimization algorithms, simulated annealing, and/or heuristics.

The design data storage 114 and/or the artificial intelligence data storage 112 may be embodied in hard disk drives, solid state memories, any other type of non-transitory computer-readable storage medium. The design data storage 114 and/or the artificial intelligence data storage 112 may include a data store. The design data storage 114 can store data (such as data objects) representing blocks and/or hardware components. The artificial intelligence data storage 112 can store training data, artificial intelligence data, and/or machine learning models. As used herein, a "data store" can refer to any data structure (and/or combinations of multiple data structures) for storing and/or organizing data, including, but not limited to, relational databases (e.g., Oracle databases, MySQL databases, etc.), non-relational databases (e.g., NoSQL databases, etc.), key-value databases, in-memory databases, tables in a database, and/or any other widely used or proprietary format for data storage.

The network 106 may be any wired network, wireless network, or combination thereof. In addition, the network 106 may be a personal area network, local area network, wide area network, cable network, satellite network, cellular telephone network, or combination thereof. In addition, the network 106 may be a publicly accessible network of linked networks, possibly operated by various distinct parties, such as the Internet. In some embodiments, the network 106 may be a private or semi-private network, such as a corporate or university intranet. The network 106 can use protocols and components for communicating via the Internet or any of the other aforementioned types of networks, such as HTTP.

The engineering system 104 may be embodied in a plurality of devices. For example, the user interface server 120, the resolver server 110, and/or the artificial intelligence server may each include one or more of a network interface, memory, hardware processor, and non-transitory computer-readable medium drive, all of which may communicate with each other by way of a communication bus. The network interface may provide connectivity over the network 106 and/or other networks or computer systems. The hardware processor may communicate to and from memory containing program instructions that the hardware processor executes in order to operate the user interface server 120 and the resolver server 110. The memory generally includes RAM, ROM, and/or other persistent and/or auxiliary non-transitory computer-readable storage media.

In some embodiments, FIGS. 2A, 2B, 2C, 2D, 2E, 2F, 2G, 2H, 2I, 2J, 2K illustrate user interfaces of the engineering system 104 described above with respect to FIG. 1. In various embodiments, aspects of the user interfaces may be rearranged from what is shown and described below, and/or particular aspects may or may not be included.

FIG. 2A illustrates a user interface 200 for designing electronic hardware systems. The user interface 200 can allow a user to create a block diagram representing an electronics hardware system. The user interface 200 can include a library area 202 and a canvas area 210. A user can design a block diagram in the canvas area 210. The user can search for, find, and/or select blocks 204A, 204B, 204C, 204D, 204E, 204F, 204G, 204H, 204I, 204J, 204K, 204L, 204M, 204N, 204O in the library area 202 to add to a block diagram. Blocks can have ports.

Each block 204A, 204B, 204C, 204D, 204E, 204F, 204G, 204H, 204I, 204J, 204K, 204L, 204M, 204N, 204O can correspond to a data object. As shown, blocks 204A, 204B, 204C, 204D, 204E, 204F, 204G, 204H, 204I, 204J, 204K, 204L, 204M, 204N, 204O can include, but are not limited to, a "DC \DC Converter," a "CAN Transceiver," a "Push Button," a "Digital Input Conditioning," a "Digital Output," a "Temperature Sensor," a "Microcontroller," a "Light Sensor," an "LED," a "WIFI TRX," a "Switch," a "PWM Driver," an "Analog Input," a "Bluetooth TRX," and an "Accelerometer Sensor" block. A user can use the library area 202 to search for blocks. In some embodiments, a user can add new blocks to the engineering system 104. There can be a one-to-many relationship between each block type and specific hardware components that match the requirements for a block of the respective block type. In other words, each block can represent a placeholder for a hardware component in an electronics system design. As described herein, the system can automatically generate designs variants of combinations of hardware components from hundreds of thousands or millions of options.

In FIG. 2B, the user interface 200 can allow a user to select a block. A user can drag a first block 204G from the library area 202 into the canvas area 210. As shown, a new first block 206A (the "Microcontroller" block here) can be created in the canvas area 210 in response to the user selection. In FIG. 2C, the user interface 200 can allow a user to select an additional block and make a connection. A user can drag a second block 204I from the library area 202 into the canvas area 210. As shown, a new second block 214A (the "LED" block here) can be created in the canvas area 210 in response to the user selection. A user can create a connection 208A between the first block 206A and the second block 214A. The connection 208A can be a "high-level" connection, which can be a connection where a user has not specified one or more port types for the connection. As described herein, the engineering system 104 can automatically resolve hardware components for each of the blocks 206A, 214A, which can include selecting a compatible port type for the high-level connection 208A. The user interface 200 can also support receiving user-specified port type(s) for the connection 208A.

In FIG. 2D, the user interface 200 can present the results of the resolving process. As described herein, the engineering system 104 can automatically select hardware components for each block and/or identify port types for connections between blocks. As shown, the presented blocks 206B, 214B can include a visual indicator 260A, 260B that demonstrates a hardware component has been resolved for each block. A user can select one of the resolved blocks 206B, 214B and information for the resolved block can be shown, such as the automatically selected hardware component and/or other hardware recommendations, which is described in further detail below with respect to FIG. 2E. A user can select the connection 208B and settings for the connection can be shown in the settings area 216. Thus, in the settings area 216, a particular port type 218 (here a "GPO" port type) has been selected.

In FIG. 2E, the user interface 200 can present information regarding a resolved block. The presented hardware component 224 (here the "RED LED THT ROUND 5MM" component) can be the hardware component that was selected for the second block 214B as shown and described above with respect to FIG. 2D. The hardware components 222A, 222B, 222C, 222D, 222E, 222F, 222G, 222H, 222I, 222J automatically recommended by the engineering system 104 and can be presented in the library area 202 of the user interface 200. As described herein, the engineering system 104 can recommend the hardware components 222A, 222B, 222C, 222D, 222E, 222F, 222G, 222H, 222I, 222J from thousands of other hardware options based on the input requirements. Information regarding the hardware component 224 can be presented in the settings area 216. While not shown in FIG. 2E, different hardware components can be presented in the user interface 200, such as the resolved hardware components for the first resolved block 206B described above with respect to FIG. 2D (which can be microcontroller hardware components).

A hardware component may be referred to as a "low-level data object" or a "HWC." The low-level data objects can correspond to the building block components of an electronics system design. Each of the hardware components 222A, 222B, 222C, 222D, 222E, 222F, 222G, 222H, 222I, 222J in the user interface 200 can be associated with a respective low-level data object that can be used to describe an electronics hardware system. Each low-level data object can include a netlist (a list of the electronic components in a circuit and a list of the nodes they are connected to), in the form of schematics and a bill of materials (BOM), and a layout. In some embodiments, a user can add new hardware components to the engineering system 104.

In FIG. 2F, the user interface 200 can allow a user to select an additional block and make a junction connection. A junction connection can refer to a connection between three or more blocks. A user can select a block from the library area 202 to add to the canvas area 210. As shown, a third block 226 (another "LED" block here) can be created in the canvas area 210 in response to the user selection. A user can create a junction connection 228 between the first block 206A, the second block 214A, and the third block 226. A user can select the junction connection 228, which can cause the user interface 200 to present the settings area 216 for the junction connection 228. A user can specify multiple port types 229A, 229B, 229C for the junction connection 228. If the engineering system 104 resolves the hardware components for each of the blocks 206B, 214B, 226, then the engineering system 104 can use one of the port types 229A, 229B, 229C for the junction connection 228 as part of the resolving process.

In FIG. 2G, the user interface 200 can allow a user to perform a search for blocks. A user can select the add-a-new-block element 230 to add the generic block 232 to the canvas area 210. A user can search for blocks using the generic block 232. A user selection of the generic block 232 can cause the settings area 216 to display settings for the generic block 232. A user can provide a category 234 (here the "Motors" category) and a sub-category 236 (here the "Brushed DC Motors" category), which can be used as parameters by the engineering system 104 to conduct a block search.

In FIG. 2H, the user interface 200 can allow a user to submit one or more specifications for a block. A user can select the add-specification element 240, which can cause the user interface 200 to present the add-specification area 238 for the selected generic block 232. In the add-specification area 238, a user can select a specific specification, an operator, and a value for the specification. As shown, a user can add a "Voltage level" specification with an "Equals" operator and a value of "500 V." A specification can be a requirement that is added to a block and that is used by the engineering system 104 when searching for matching hardware components. Thus, the engineering system 104 can search for any hardware components matching the specified category/sub-category (here a motor/brushed dc motor) and specification (here a "Voltage Level" that "Equals" a value of "500 V"). In some embodiments, a specification can be a requirement for an attribute of a block. In some embodiments, there can be many (such as hundreds or thousands) of attributes that a user can use in a specification. Additional operators, can include, but are not limited to, "Not equal to," "Greater than," "Less than," "Greater than or equal to," "Less than or equal to," or "Between." Following entering of the specification, a user can take additional operations (not shown in FIG. 2H), such as making a high-level connection between the generic block 232 and another block in the diagram, such as the first block 206B. The resolving process for the diagram, which can include the generic block 232, can be initiated.

In FIG. 2I, the user interface 200 can allow a user to submit one or more port types for a block. A user can modify the diagram from FIG. 2H to result in the diagram of FIG. 2I. As shown in FIG. 2I, a user can specify a port type (here a "CAN" port type) in the settings area 216 for the selected block 242A that is connected to the first block 206B (here a Microcontroller block).

In FIG. 2J, the user interface 200 can allow a user to submit one or more port types for a block. As shown in FIG. 2J, a user can specify a first port type 254 (here a "3V3" port type) in the settings area 216 for the selected block 242B that is connected to the first block 206B (here a Microcontroller block). The port type for the connection 248 between the first block 206B and the second block 214B can be the same first port type 254 (such as a "3V3" port type). Thus, the two connections in the diagram can both be of the same port type.

In FIG. 2K, the user interface 200 can present a new project. In the canvas area 210, a diagram 256 can be presented. As depicted, the blocks and links of the diagram 256 can be resolved. Accordingly, each of the blocks of the diagram 256 can have a corresponding recommended hardware component and each connection of the diagram 256 can have an assigned port type. As described herein, the engineering system 104 can efficiently generate design variants (particular combinations of hardware components) for the diagram 256 out of a large number of hardware components from the hardware components database and an even larger number of permutations of hardware components.

In FIG. 2L, a user interface 260 for presenting design variants is depicted. The graphical user interface 260 includes a design variant area 262, a filter area 266, and a navigation area 268. The design variant area 262 can include a first visualization 264A and a second visualization 264B. Each of the visualizations 264A, 264B can present information associated with a particular key performance indicator. The first visualization 264A can be associated with a cost key performance indicator and the second visualization 264B can be associated with an area key performance indicator. Any of the key performance indicators described herein can be presented in a visualization, such as, but not limited to, availability, maturity, or reliability. The visualization(s) 264A, 264B allow a user to view design variants along different key performance indicator dimensions. As shown, key performance indicators for the same design variant (shown as a point in the visualization(s) 264A, 264B) can be simultaneously present (here the design variant can have a cost of $20.05 and have an area of 28.03 cm$^2$). If the user selects a different design variant the visualization(s) 264A, 264B can update accordingly. In some embodiments, the visualization(s) 264A, 264B can depict indicators for design variants on one axis the and a key performance indicator on the other axis. As shown, selecting a different point in the visualization(s) 264A, 264B can highlight a different design variant in the visualization(s) 264A, 264B.

A user can update the visualization(s) 264A, 264B using the filter area 266. The user can add one or more filters that limit the design variants that are shown in the visualization(s) 264A, 264B. In some embodiments, the filter can be for particular key performance indicators (such as setting a range, minimum, and/or maximum on a key performance indicator) or other parameter (such as number of components). As shown, a user can set a cost window and a maximum number of components. A user can use the navigation area 268 to update the graphical user interface 260 to focus on a visualization for a particular key performance indicator.

Figure 3A:
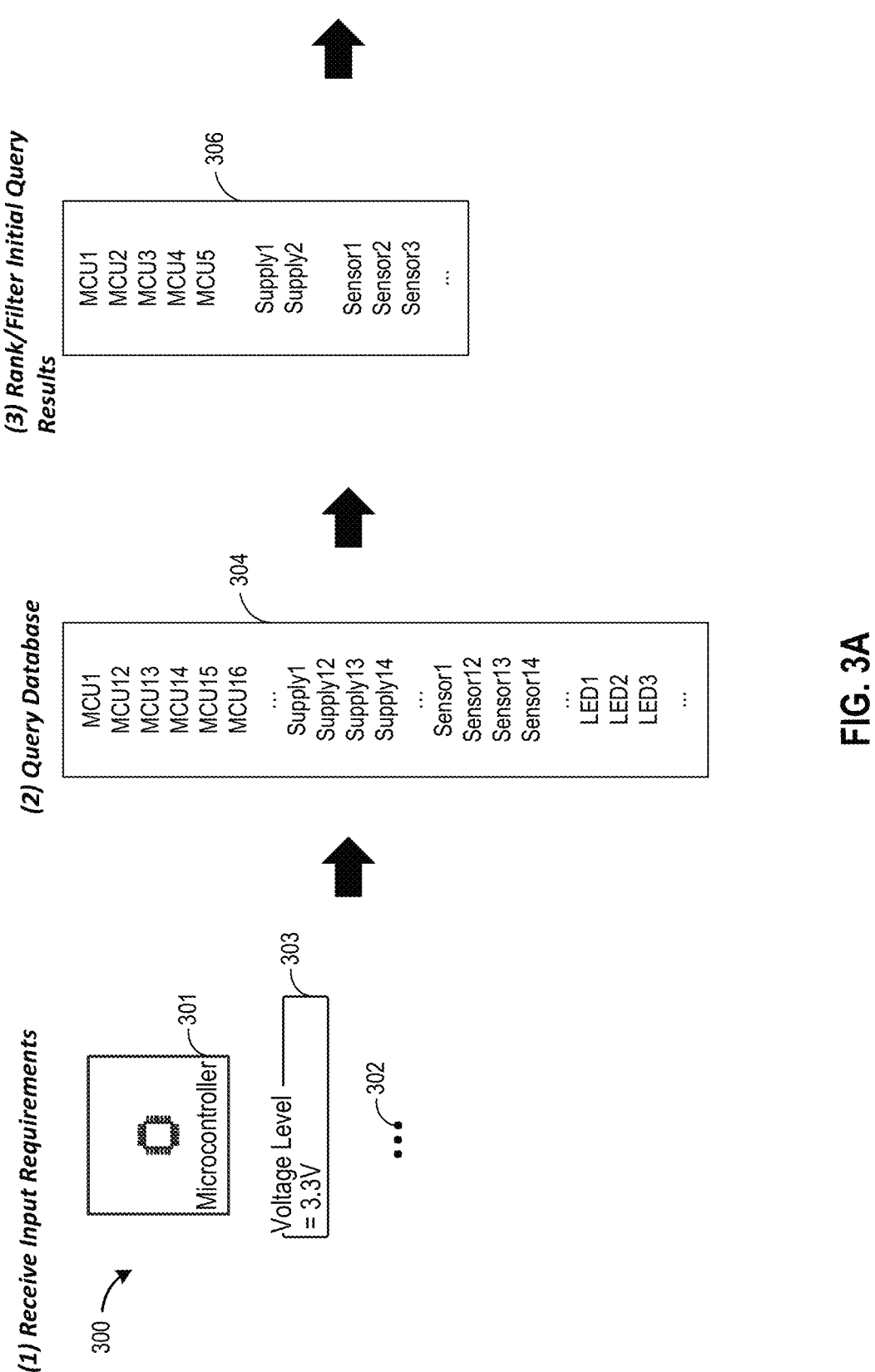
FIGS. 3A-3B are flow diagrams depicting steps for automatically generating a solution variant.
Figure 3B:
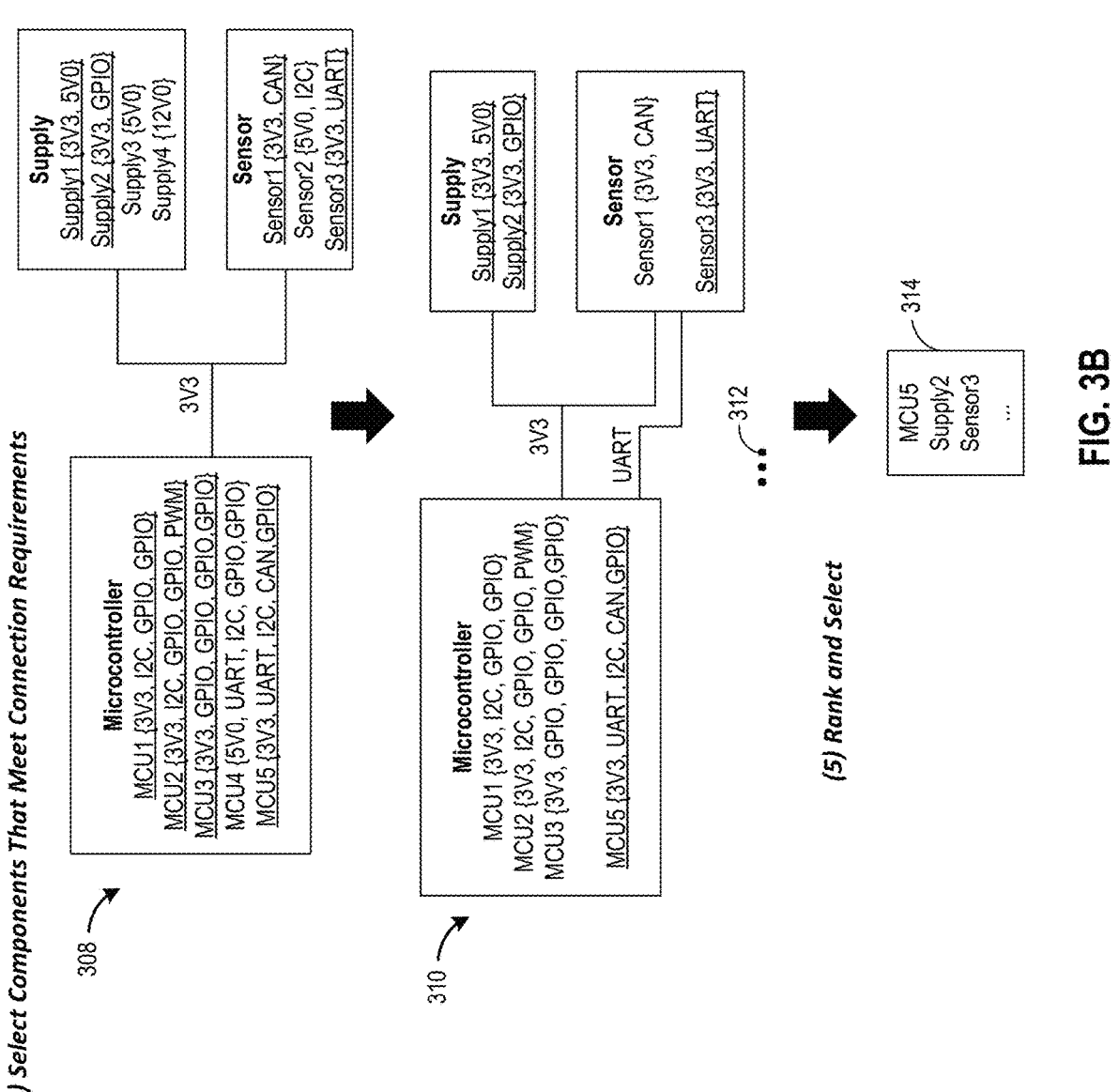

With reference to FIGS. 3A-3B, steps are depicted for automatically generating a solution variant for an electronic hardware system. Some of the depicted steps shown in FIGS. 3A-3B may be performed by components of the environment 100 of FIG. 1, such as the user interface server 120, the resolver server 110, and/or the artificial intelligence server 130. Some or all of depicted steps may be optional depending on the circumstances or embodiment. Other steps (not illustrated) may be possible in accordance with the present disclosure in other embodiments.

In FIG. 3A, at step one (1), the engineering system 104 can receive input requirements 300. As described herein, the input requirements 300 can be received, such as the user interface server 120 receiving requirements via user input. The input requirements 300 can include the blocks 301 of an electronics system design (such as a microcontroller block), which can include specification(s) 303 for the blocks, such as, but not limited to, a particular voltage level (here 3.3V), a maximum operating temperature, a maximum clock frequency, a memory size, etc. The user input can include one or more categories or sub-categories for each block (such as a "Microcontroller," "LED," or "Supply," category). While not shown, the input requirements 300 can include connections between the blocks. The depicted ellipsis 302 represents that the input requirements can include additional blocks and/or specifications. Additional details regarding receiving input requirements are described herein, such as, with respect and not limited to, FIGS. 2B, 2C, 2F-2H. As described above with respect to FIG. 2G, a user can use the add-a-new-block element 230 to add a block of a particular category or sub-category. The resolver server 110 can further receive the input requirements 300.

At step two (2), the resolver server 110 can query a hardware components database 304. In some embodiments, the resolver server 110 can query the hardware components database 304 multiple times, such as once per block in the input requirements 300. The resolver server 110 can query the hardware components database 304 based on the category type of each block and any specifications for each block. As shown, the hardware components database 304 can include representations of hardware components, such as, but not limited to, microcontrollers, power supplies, sensors, LEDs, etc.

At step three (3), the initial query results 306 can be ranked and/or filters. As described herein, the artificial intelligence server 130 can determine a project category for the design specification (such as an automotive application). Accordingly, if there are initially ten microcontroller results, the resolver server 110 can remove microcontrollers that are unsuitable for a particular project category (for example, some microcontrollers may not meet certain standards for that category). The resolver server 110 can also rank the hardware components based on criteria, such as, but not limited to, cost, quality, area, etc. In some embodiments, the resolver server 110 can request from the artificial intelligence server 130 that an artificial intelligence algorithm be applied to the initial query results 306 to either rank and/or filter the results.

At step four (4), the resolver server 110 can select hardware components that meet the connection requirements based on the electronics system design, which can include blocks and connections between blocks. A representation of a first portion 308 of the electronics system design is shown, which includes three blocks connected by a junction connection where each block is associated with the initial hardware-component results. As described herein, the initial query results of the hardware components can be filtered and/or ranked. As described herein, the connections between the blocks can be high-level connections in that a specific port type hasn't been selected and the resolver server 110 can select available port types based on the available hardware components. The resolver server 110 can determine that the junction connection with a specific port type of "3V3" and the hardware components "MCU1," "MCU2," "MCU3," "MCU5," "Supply1," "Supply2," "Sensor1," and "Sensor3" (as underlined in FIG. 3B) are feasible since each of the foregoing components have the same port type "3V3" available for use.

Continuing at step four (4), the resolver server 110 can further select hardware components that meet additional connection requirements based on the electronics system design. A representation of a second portion 310 of the electronics system design is shown, which includes the three blocks connected by the junction connection and an additional connection between the microcontroller block and the sensor block. As described herein, the connection between the microcontroller block and the sensor block can be a high-level connection. After processing the junction connection, the resolver server 110 can remove the "3V3" port from the available pool of port types and can begin processing the second connection between the microcontroller block and the sensor block. The resolver server 110 can determine that the second connection with a specific port type of "UART" and the hardware components "MCU5" and "Sensor3" (as underlined in FIG. 3B) are feasible since each of the foregoing components have the same port type "UART" available for use. The depicted ellipsis 312 represents that the resolver server 110 can continue processing additional portions of the electronics system design, which can include additional blocks and/or connections in the electronics system design (not depicted).

At step five (5), the remaining hardware components can be ranked (if applicable) and selected. The resolver server 110 can select the hardware components "MCU5" and "Sensor3" as the recommended hardware components based on the first and second connections. The resolver server 110 can use a ranking for the hardware components "Supply1" and "Supply2" to select the hardware component "Supply2" as the higher ranked component. Thus, the resolver server can determine and provide the recommended hardware components 314, which can include the port types for the connections between the hardware components. Additionally or alternatively, the resolver server 110 can request from the artificial intelligence server 130 that an artificial intelligence algorithm be applied to the potential hardware component(s). For example, as described herein, the artificial intelligence server 130 can apply a simulated annealing algorithm to the potential candidate solutions to determine the solution variant.

Figure 4:
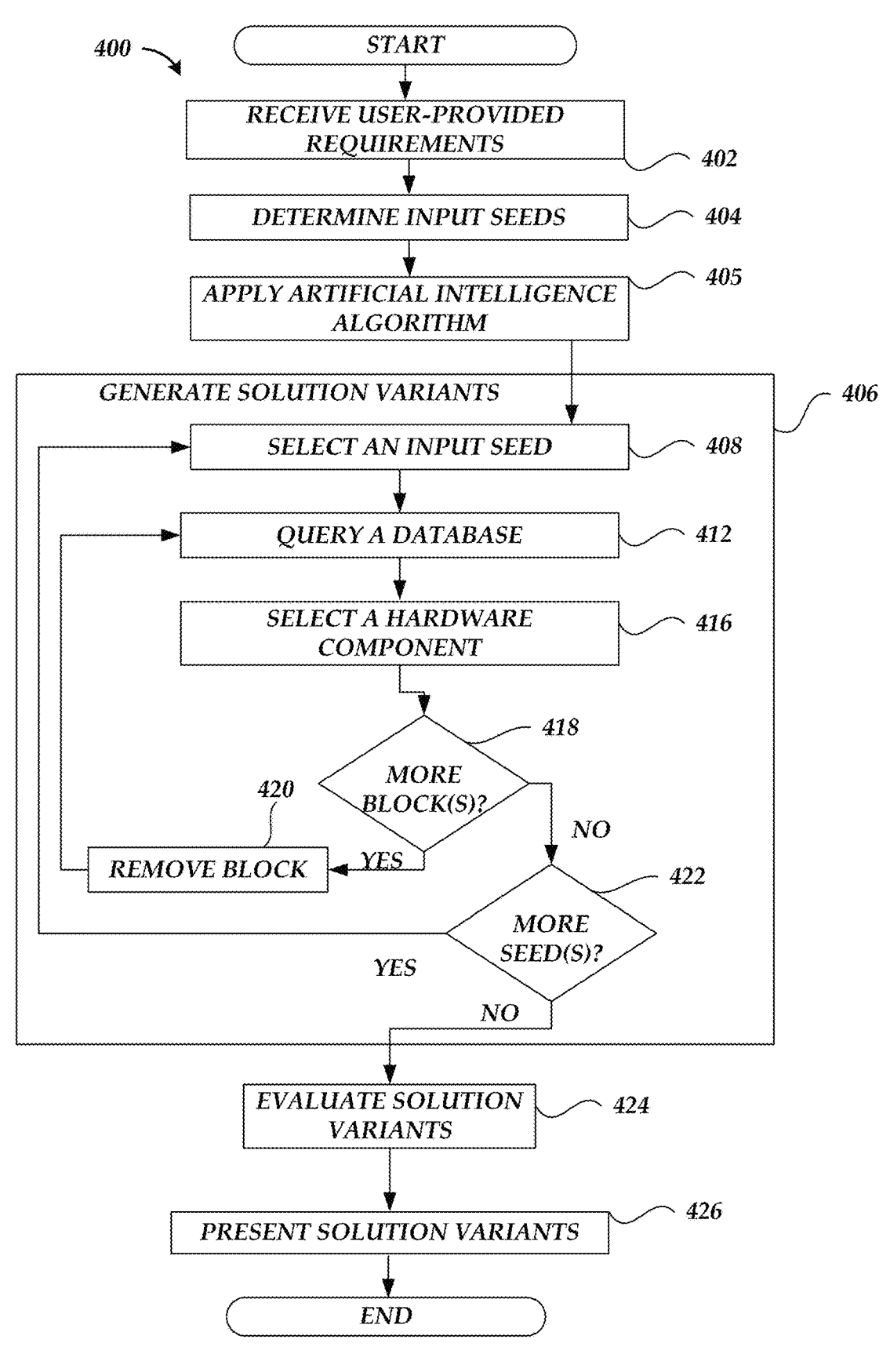
FIG. 4 is a flow chart depicting a method for automated artificial intelligence based electronics design.

FIG. 4 is a flow diagram depicting a method 400 implemented by the engineering system 104 for automated electronics design, among other things. As described herein, the engineering system 104 may include the resolver server 110 and the artificial intelligence server 130. In some embodiments, the resolver server 110 may implement a resolver service that implements aspects of the method 400 and/or the artificial intelligence server 130 may implement an artificial intelligence service that implements aspects of the method 400. Some aspects of the method 400 may be implemented by other components of the engineering system 104, such as the user interface server 120.

Beginning at block 402, input requirements can be received. The user interface server 120 can initially receive at least some of the input requirements. The input requirements can include a design specification that includes blocks of an electronics system design (such as a microcontroller block, an LED block, a supply block, etc.) and connections between the blocks. The input requirements can include specification(s) for the blocks, such as, but not limited to, a particular voltage level (here 3.3V), a maximum operating temperature, a maximum clock frequency, a memory size, etc. A specification can include an attribute, an operator, and an attribute value. Some input requirements can include a selection of a port type for a connection. Additional details regarding receiving input requirements are described herein, such as, with respect and not limited to, FIGS. 2A-2K. In some embodiments, the input requirements can include which of the key performance indicator(s) have priority for the design specification (such as cost or area). In some embodiments, the priority for the key performance indicator(s) can be provided by a user. A graphical user interface provided by the user interface server 120 can receive the priority in some embodiments. The resolver server 110 can further receive the input requirements. In some embodiments, the input requirements (which can include an electronics system design) can be represented in a description language, such as, but not limited to, JavaScript Object Notation (JSON) or XML.

At block 404, input seeds can be determined. The resolver server 110 can determine the input seeds. As described herein, the input seeds can be used for generation of the design variants. In some embodiments, an advantage to using varying input seeds is that can cause the resolver server 110 to generate different design variants based on the varying input seeds. In some embodiments, the input seeds can be a set of ranges. The resolver server 110 can determine the set of ranges (including at least a first range and a second range), which can be for one or more key performance indicators. For example, for a cost key performance indicator, the resolver server 110 can determine a set of cost ranges up to some value (such as each sub-range proceeding in increments). As described herein, a user can provide filters associated with the design variant generation; therefore, the resolver server 110 can use the user-provided filters when determining the set of ranges. In a cost key performance indicator filter example (such as cost being set to between $10 and $30), the resolver server 110 can determine sub-ranges within the filter (such as a cost range incrementing every $2 within the parent range). In some embodiments, if a user provides a priority for a key performance indicator (such as an area key performance indicator being ranked higher than a cost key performance indicator or vice versa), then the resolver server 110 can determine the input seeds based on that priority.

As described herein, the input seeds can be dynamically determined. In some embodiments, the input seeds can be pseudo-randomly determined. The resolver server 110 can select different key performance indicators to be used as an input seed. In some embodiments, the resolver server 110 can pseudo-randomly select between key performance indicators and/or can pseudo-randomly generate different values for key performance indicators to be used as input seeds. The resolver server 110 can pseudo-randomly generate a number and the input seed can be or can include the number.

In some embodiments, input seeds can be generated iteratively. The resolver server 110 can use a threshold number to determine how many solution variants to generate. The resolver server 110 can generate an input seed iteratively for each of the threshold number of solution variants.

At block 405, an artificial intelligence algorithm can be applied. The resolver server 110 can request, from the artificial intelligence server 130, an artificial intelligence algorithm execution. The artificial intelligence server 130 can apply an artificial intelligence algorithm based on the design specification. The executed artificial intelligence algorithm can output an inference. The artificial intelligence server 130 can provide the inference to the resolver server 110.

The artificial intelligence server 130 can apply a machine learning model based on the design specification. The machine learning models described herein can include, but are not limited to, decision trees, classification models, clustering models, deep-learning models, neural networks, encoder-decoder models, and/or transformer models. In some embodiments, the machine learning model can receive an input vector that represents the design specification. In some embodiments, the machine learning model can be trained to output a predicted category. The predicted category can be a category of the design specification. For example, a predicted category for a design specification can be an automotive project category. In some embodiments, the machine learning models can be trained with supervised machine learning to predict categories for design specifications.

In some embodiments, the artificial intelligence server 130 can use machine learning clustering based on the design specification. The artificial intelligence server 130 can apply a machine learning model to an input vector that represents the design specification. The machine learning model can output one or more predictions, such as key performance indicators. The artificial intelligence server 130 can cluster the output (which can include n-dimensions) from multiple design specifications using a clustering algorithm, such as, but not limited to, a K-means clustering algorithm. The artificial intelligence server 130 can determine groups from the clusters. Thus, the artificial intelligence server 130 can process a new design specification and map the design specification to a group, which can be used as described herein. For example, the resolver server 110 can use the group to filter and/or rank hardware components based on certain hardware components being used in some groups more than other groups.

The artificial intelligence server 130 can apply a heuristic based on the design specification. In some embodiments, the heuristic can identify a particular block in the design specification. For example, the artificial intelligence server 130 applying the heuristic can determine that a first block has more connections than a second block in the design specification (such as a block with the highest amount of connections in the design specification). The resolver server 110 and/or the artificial intelligence server 130 can be programmed to apply other heuristics for hardware component resolution, such as, but not limited to, preventing electronic traces from having ninety degree angles, ensuring power dissipation is approximately distributed evenly across the board area, and/or ensuring electromagnetic interference-sensitive projects have boards with at least a threshold level of layers (such as four or more layers) for shielding.

At block 406, solution variants can be generated. The resolver server 110 can generate the solution variants. Generating the solution variants can include the execution of the sub-blocks 408, 412, 416, 418, 420, 422 for selecting an input seed, querying a database, selecting hardware components in a loop, and selecting more seeds in a loop. In some embodiments, the blocks 412, 416 for querying a database and selecting hardware components can be performed for each block in the design specification. At block 408, an input seed can be selected. The resolver server 110 can select an input seed from the multiple input seeds determined at the previous block 404. In some embodiments, the resolver server 110 can select a range from the multiple ranges. For example, for a cost performance key indicator, resolver server 110 can select a range a first range for cost (such as a range between $10 and $12 or a range between $10 and $20, for example). As described herein, in some embodiments, a selected input seed can be a pseudo-randomly selected key performance indicator, which can include a pseudo-randomly selected range for a key performance indicator. In some embodiments, the resolver server 110 can generate the solution variants based on the input seed.

At block 412, a database can be queried. The resolver server 110 can generate one or more query parameters based on the input requirements, which can include the blocks. The hardware components database can include representations of hardware components, such as, but not limited to, micro-controllers, power supplies, sensors, LEDs, etc. In some embodiments, each category type of a block can have its own table in the hardware components database. The resolver server 110 can convert a specification for the first block to a first query parameter, wherein the specification includes an attribute and attribute value. Additional details regarding specifications are described herein, such as with respect to FIG. 2H. In some embodiments, the resolver server 110 can query a hardware components database multiple times, such as once per block in the input requirements. As described herein, an artificial intelligence algorithm can indicate which block from the design specification to process before other blocks. As described herein, it can be advantageous to process some blocks first for efficiency purposes (such as a block with the most constraints). The resolver server 110 can query the hardware components database based on the category type of each block and any specifications for each block. The resolver server 110 can receive, from the hardware components database, results responsive to the query, where each result is associated with a hardware component.

At block 416, a hardware component can be selected. The resolver server 110 can select a hardware component. In some embodiments, the resolver server 110 can rank (such as by sorting) the hardware components based on criteria, such as, but not limited to, a key performance indicator (cost, quality, reliability, etc.) or any other factor. As described herein, a user can select and/or prioritize key performance indicators, which can be used for hardware component selection. The resolver server 110 can identify, from the results, a subset of hardware components for the block. In some embodiments, such as where the artificial intelligence algorithm output a predicted category for the design specification, the resolver server 110 can adjust the ranking of hardware components from the subset of hardware components that are associated with the predicted category. For example, if the predicted category is for an automotive project, then the resolver server 110 can rate hardware components used in automotive projects higher than other hardware components. In some embodiments, the resolver server 110 can select a hardware component with the highest ranking.

In some embodiments, the resolver server 110 can determine the ranking for the subset of hardware components based on the range. The resolver server 110 can remove hardware components from selection that fail to satisfy the range. For example, for a cost range, the resolver server 110 can remove hardware components with estimated costs that fail to satisfy the cost range. The resolver server 110 can rank hardware components based on cost within the cost range.

In some embodiments, the resolver server 110 can identify, from the results, a subset of hardware components with a matching port type for a connection between two or more blocks. Additional details regarding using matching port types for hardware component resolution and/or hardware resolution can be found in U.S. Provisional Application No. 63/371,500, filed Aug. 15, 2022, entitled "SYSTEMS AND METHODS FOR AUTOMATED ELECTRONICS DESIGN AND GRAPHICAL USER INTERFACE."

At block 418, it can be determined whether there are additional blocks to process. The resolver server 110 can proceed through the input requirements and check for additional blocks that have not already been resolved to one or more hardware components. If there are additional blocks, the method can proceed to block 420 to remove the block from the unresolved blocks. If there are no additional blocks for processing, the method can proceed to block 422 to determine if there are additional seeds to process and design variants to generate. At block 420, a block can be removed. The resolver server 110 can remove the resolved block from the pool of available blocks and proceeds back to block 412 for additional processing.

In some embodiments, in addition to or alternative to what is shown in FIG. 4, an artificial intelligence algorithm can be applied for each input seed. The artificial intelligence server 130 can apply an artificial intelligence algorithm based on the hardware components for the design specification and the input seed. The artificial intelligence algorithm can output an inference.

The artificial intelligence server 130 can execute a simulated annealing algorithm on the one or more hardware components, where the simulated annealing algorithm generates a candidate solution as an inference. A simulated annealing algorithm can be a search algorithm. Some simulated annealing algorithms can find global optima when there may be several local optima. A simulated annealing algorithm can maintain a candidate solution and takes steps of a random size from the candidate in the search space. New points that are not as good as the current point (worse points) may be accepted sometimes. The name of the algorithm is from "annealing" in metallurgy where metal is heated to a high temperature quickly, then cooled slowly. At high temperatures, atoms may shift unpredictably, often eliminating impurities as the material cools. This can be replicated via the simulated annealing algorithm, with an energy state corresponding to a current solution. In some embodiments, an initial "temperature" can be set (such as being set to one) and a minimum "temperature" (such as a number set relatively close to zero). The current "temperature" can be multiplied by some fraction alpha and then decreased until it reaches the minimum temperature. For each distinct "temperature" value, the core optimization routine can be run a number of times. The simulated annealing algorithm can take a set of hardware components as input to an objective function and the objective function can output a value that is an evaluation of the set of components. The objective function can be based on one or more parameters, such as key performance indicator(s) that take evaluate the set based on estimated cost, area, etc. The simulated annealing algorithm can use input seeds for pseudo-randomly generated numbers to generate different solution variants.

In some embodiments, the simulated annealing algorithm (executed via the artificial intelligence server 130) can generate a candidate solution and then evaluate it using the objective function. The core optimization routine can be run a predefined number of times (such as 10, 100, or 1,000 times). The first step of the optimization iteration can be to generate a new candidate solution from the current working solution, which can be referred to as "taking a step." A random step can be taken within a predefined "step size" parameter. The artificial intelligence server 130 can evaluate the candidate solution by checking if the evaluation of this new solution is as good as or better than the current best solution, and if it is, replace the current best solution with the new solution. The artificial intelligence server 130 can calculate a difference between the objective function evaluation of the current best solution and the current working solution. The artificial intelligence server 130 can accept the new solution as the current working solution if it has a better objective function evaluation or if the objective function is worse, but the artificial intelligence server 130 probabilistically decide to accept it based on the current "temperature." As described herein, the simulated annealing algorithm can start at a "temperature" and continue until the minimum "temperature" is reached.

At block 422, it can be determined whether there are additional input seeds to process. The resolver server 110 can process the input seeds that have not already been processed. If there are input seeds for processing, the method 400 can proceed to block 408 to select an unprocessed input seed. Additional details regarding generating a solution variant are described herein, such as with respect to FIGS. 3A-3B. If there are no additional input seeds for processing, the method 400 can proceed to block 422 for evaluating the solution variants.

At block 424, solution variants can be evaluated. The resolver server 110 can evaluate solution variants. As described herein, the resolver server 110 can use one or more of the following to evaluate the solution variants: (i) rules-based analysis; (ii) a library of examples of earlier related types of design projects; (iii) artificial-intelligence based analysis, such as machine learning; (iv) a catalog of circuit component parts generated by component manufacturers; (v) analytical calculations, such as calculations based on mathematical functions (such as physics calculations) and/or statistical calculations; and/or (vi) heuristics.

The resolver server 110 can determine a first key performance indicator associated with the first solution from the solution variants. As described herein, a key performance indicator can include, but not be limited to, at least one of an estimated project cost, area, component availability, maturity, and/or reliability. In the context of rules-based evaluation, the resolver server 110 can determine that an area rule applies to the first solution variant. The resolver server 110 can calculate the first key performance indicator by applying a coefficient to an initial area of the first solution variant. For example, the resolver server 110 can multiply an initial area by a particular coefficient (such as 1.1) based on the sum total of estimated power dissipation for the solution. For example, if a solution (such as a solution for an Internet of Things (IoT) device) has a low power dissipation then the solution may use a relatively lower coefficient (something less than 1.1) As another example, the resolver server 110 can determine that a particular surface mount package (such as a Ball Grid Array) is used in the design specification, and, therefore, the resolver server 110 can multiply an initial area by a particular coefficient (such as 1.2).

The resolver server 110 can request, from the artificial intelligence server 130, an artificial intelligence algorithm execution to evaluate a solution variant. The artificial intelligence server 130 can apply a machine learning model based on a first solution variant. The machine learning model can output a result and the artificial intelligence server 130 can provide the result to the resolver server 110.

The resolver server 110 can calculate a first key performance indicator based on the model result. The artificial intelligence server 130 can use a library of examples of earlier types of design projects to train the machine learning model. The machine learning model can output an estimated area coefficient. The library can include previous projects and associated data regarding the actual area coefficients, which can be used to train the machine learning model. Thus, the model can output a result, such as a 7% coefficient instead of the 10% coefficient that was used in a rules-based analysis.

The resolver server 110 can use one or more catalogs of hardware components to determine one or more key performance indicators for a solution variant. A catalog can include information regarding the hardware components, such as, but not limited to, cost, availability, production sites, stock, among others. The resolver server 110 can combine a cost for each hardware component of a first solution variant into a total cost, where the first key performance indicator is or includes the total cost. The resolver server 110 can determine an estimated level of availability (such as no, low, medium, or high availability) for each hardware component of the first solution variant. The resolver server 110 can determine a combined level of availability from each estimated level of availability, where the first key performance indicator can include or be the combined level of availability. In some embodiments, if a threshold number of hardware components have a low or no availability (which can be set to a single hardware component), then the engineering system 104 can present the entire availability for a solution variant is low or no availability. Similar to an availability key performance indicator, the resolver server 110 can determine a reliability key performance indicator in a similar manner. The resolver server 110 can determine an estimated level of reliability (such as low, medium, or high reliability) for each hardware component of the first solution variant; and determine a combined level of reliability from each estimated level of reliability, where the first key performance indicator is or includes the combined level of reliability. If a threshold number of hardware components have a low reliability (which can be set to a single hardware component), then the engineering system 104 can present the entire reliability for a solution variant as low. The resolver server 110 can use mathematical functions to calculate key performance indicators. The resolver server can use mathematical functions, such as, but not limited to, geometrical functions to calculate area, perimeter, volume, and/or other solution dimensions or metrics; physical effect calculations, such as, resistance and/or capacitance calculations; and/or statistical methods based on historical data to calculate supply chain risk.

At block 426, solution variants can be presented. The user interface server 120 can present solution variants. The user interface server 120 can present one or more key performance indicators in the graphical user interface. The user interface server 120 can present, in the graphical user interface, a first visualization (such as a graph) associated with the first key performance indicator, where each solution variant is associated with an indicator on the visualization (such as a first point on the first graph). The user interface server 120 can similarly present additional visualizations for additional key performance indicators in the graphical user interface. Additional details regarding visualizations are described herein, such as with respect to FIG. 2L.

Some of the blocks of the method of 400 of FIG. 4 describe using machine learning. The artificial intelligence server 130 can train the one or more machine learning models. The artificial intelligence server 130 determine training data that includes previous design specifications and a label for each design specification. Additionally or alternatively, the artificial intelligence server 130 can determine training data that includes previous solutions and a label for each solution. The artificial intelligence server 130 can train the machine learning model using the training data. The artificial intelligence server 130 can train the machined learning model by adjusting a weight of the machine learning model based on labels associated with the design specifications and/or the solutions. The training labels can be associated with project categories and/or key performance indicates, such as, cost, area, reliability, etc. In some embodiments, the artificial intelligence server 130 can use backpropagation type training algorithm(s). The artificial intelligence server 130 can use backpropagation to readjust the weights of a machine learning model to reduce output error. The error can be propagated backward during backpropagation from an output to an input layer. This error can then be used to calculate a gradient of a cost function with respect to each weight.

Figure 5:
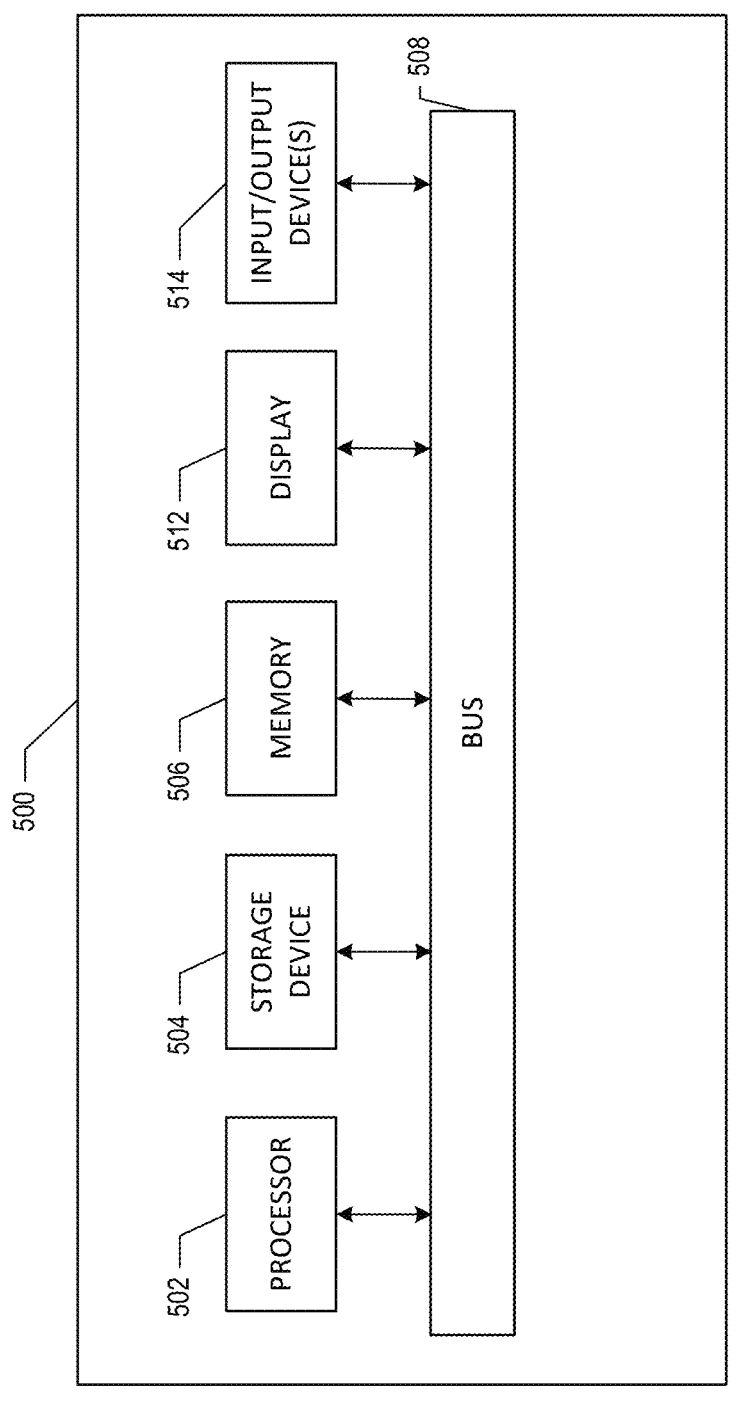
FIG. 5 is a block diagram illustrating an example computing system with which various methods and systems discussed herein may be implemented.

FIG. 5 is a block diagram that illustrates example components of a computing device 500. The computing device 500 can implement aspects of the present disclosure. With respect to FIG. 1, the resolver server 110, the artificial intelligence server 130, or the user interface server 120 of FIG. 1 can be implemented in a similar manner as the computing device 500. The computing device 500 can communicate with other computing devices.

The computing device 500 can include a hardware processor 502, a data storage device 504, a memory device 506, a bus 508, a display 512, and one or more input/output devices 514. The hardware processor 502 can also be implemented as a combination of computing devices, e.g., a combination of a digital signal processor and a microprocessor, a plurality of microprocessors, one or more microprocessors in conjunction with a digital signal processor, or any other such configuration. The hardware processor 502 can be configured, among other things, to execute instructions to perform one or more functions. The data storage device 504 can include a magnetic disk, optical disk, solid state drive, or flash drive, etc., and is provided and coupled to the bus 508 for storing information and instructions. The memory device 506 can include one or more memory devices that store data, such as, without limitation, random access memory (RAM) and read-only memory (ROM). The computing device 500 may be coupled via the bus 508 to the display 512, such as an LCD display or touch screen, for displaying information to a user, such as an engineer. The computing device 500 may be coupled via the bus 508 to one or more input/output devices 514. The input device 514 can include, but is not limited to, a keyboard, mouse, digital pen, microphone, or touch screen.

A resolver application and/or an artificial intelligence application may be stored on the memory device 506 and executed as a service by the hardware processor 502. In some embodiments, the resolver application and/or an artificial intelligence application may implement various aspects of the present disclosure. The resolver application and/or an artificial intelligence application can automatically generate and/or evaluate solution variants for an electronics system design.

While some embodiments discuss a drag and drop feature, additional or alternative embodiments may support other user interface interactions. In some embodiments, a user can design at least a portion of an electronic hardware system with a user interface without using a drag and drop feature.

The user interfaces described herein may support receiving input via keyboard-only access (such as a command-line interface) and/or voice input.

It is to be understood that not necessarily all objects or advantages may be achieved in accordance with any particular embodiment described herein. Certain embodiments may be configured to operate in a manner that achieves or optimizes one advantage or group of advantages as taught herein without necessarily achieving other objects or advantages as may be taught or suggested herein.

Many other variations than those described herein will be apparent from this disclosure. For example, depending on the embodiment, certain acts, events, or functions of any of the algorithms described herein can be performed in a different sequence, can be added, merged, or left out altogether (e.g., not all described acts or events are necessary for the practice of the algorithms). Moreover, in certain embodiments, acts or events can be performed concurrently, e.g., through multi-threaded processing, interrupt processing, or multiple processors or processor cores or on other parallel architectures, rather than sequentially. In addition, different tasks or processes can be performed by different machines and/or computing systems that can function together.

The various illustrative logical blocks and modules described in connection with the embodiments disclosed herein can be implemented or performed by a machine, such as a processing unit or processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A processor can be a microprocessor, but in the alternative, the processor can be a controller, microcontroller, or state machine, combinations of the same, or the like. A processor can include electrical circuitry configured to process computer-executable instructions. In another embodiment, a processor includes an FPGA or other programmable device that performs logic operations without processing computer-executable instructions. A processor can also be implemented as a combination of computing devices, e.g., a combination of a DSP and a microprocessor, a plurality of microprocessors, one or more microprocessors in conjunction with a DSP core, or any other such configuration. Although described herein primarily with respect to digital technology, a processor may also include primarily analog components. For example, some or all of the signal processing algorithms described herein may be implemented in analog circuitry or mixed analog and digital circuitry. A computing environment can include any type of computer system, including, but not limited to, a computer system based on a microprocessor, a mainframe computer, a digital signal processor, a portable computing device, a device controller, or a computational engine within an appliance, to name a few.

Conditional language used herein, such as, among others, "can," "might," "may," "e.g.," "for example," and the like, unless specifically stated otherwise, or otherwise understood within the context as used, is generally intended to convey that certain embodiments include, while other embodiments do not include, certain features, elements, or states. Thus, such conditional language is not generally intended to imply that features, elements or states are in any way required for one or more embodiments.

Disjunctive language such as the phrase "at least one of X, Y, or Z," unless specifically stated otherwise, is otherwise understood with the context as used in general to present that an item, term, etc., may be either X, Y, or Z, or any combination thereof (e.g., X, Y, and/or Z). Such disjunctive language is not generally intended to, and should not, imply that certain embodiments require at least one of X, at least one of Y, and at least one of Z to each be present. Thus, the term "or" is used in its inclusive sense (and not in its exclusive sense) so that when used, for example, to connect a list of elements, the term "or" means one, some, or all of the elements in the list.

Any process descriptions, elements or blocks in the flow diagrams described herein and/or depicted in the attached figures should be understood as potentially representing modules, segments, or portions of code which include one or more executable instructions for implementing specific logical functions or elements in the process. Alternate implementations are included within the scope of the embodiments described herein in which elements or functions may be deleted, executed out of order from that shown, or discussed, including substantially concurrently or in reverse order, depending on the functionality involved.

The term "a" as used herein should be given an inclusive rather than exclusive interpretation. For example, unless specifically noted, the term "a" should not be understood to mean "exactly one" or "one and only one"; instead, the term "a" means "one or more" or "at least one," whether used in the claims or elsewhere in the specification and regardless of uses of quantifiers such as "at least one," "one or more," or "a plurality" elsewhere in the claims or specification.

The terms "comprising," "including," "having," and the like are synonymous and are used inclusively, in an open-ended fashion, and do not exclude additional elements, features, acts, operations, and so forth.

While the above detailed description has shown, described, and pointed out novel features as applied to various embodiments, it will be understood that various omissions, substitutions, and changes in the form and details of the devices or algorithms illustrated can be made without departing from the spirit of the disclosure. As will be recognized, certain embodiments described herein can be embodied within a form that does not provide all of the features and benefits set forth herein, as some features can be used or practiced separately from others.

What is claimed is:

1. A computer-implemented method for automated electronics design, the computer-implemented method comprising:

under control of a computer hardware processor configured with computer executable instructions, receiving a design specification, the design specification comprising a plurality of blocks and a first connection, wherein the first connection connects a first block and a second block;

determining a set of ranges for a first key performance indicator, the set of ranges comprising a first range and a second range;

applying an artificial intelligence algorithm based on the design specification, wherein the artificial intelligence algorithm outputs an inference;

generating a plurality of solution variants based on the inference, wherein generating the plurality of solution variants comprises:

for each range of the set of ranges, for each block of the plurality of blocks, determining query parameters based on block, executing a query of a database with the query parameters, receiving, from the database, a plurality of results responsive to the query, wherein each result of the plurality of results is associated with a hardware component, identifying, from the plurality of results, a subset of hardware components for the block, determining a ranking for the subset of hardware components based on the range, and selecting, from the subset of hardware components, a hardware component based on the ranking; and presenting the plurality of solution variants in a graphical user interface.

2. The computer-implemented method of claim 1, wherein applying the artificial intelligence algorithm further comprises:

applying a machine learning model based on the design specification, wherein the machine learning model outputs a predicted category, the inference comprising the predicted category, wherein determining the ranking for the subset of hardware components further comprises:

adjusting the ranking of hardware components from the subset of hardware components that are associated with the predicted category.

3. The computer-implemented method of claim 2, further comprising:

determining training data comprising a plurality of design specifications and a label for each design specification from the plurality of design specifications; and training the machine learning model using the training data, wherein training the machined learning model comprises adjusting a weight of the machine learning model based on labels associated with the plurality of design specifications.

4. The computer-implemented method of claim 1, wherein applying the artificial intelligence algorithm further comprises:

applying a heuristic based on the design specification, wherein the heuristic identifies the first block from the plurality of blocks, wherein generating the plurality of solution variants further comprises:

causes the first block to be processed before other blocks from the plurality of blocks.

5. The computer-implemented method of claim 4, wherein applying the heuristic further comprises:

determining, from the design specification, that the first block has more connections than the second block.

6. The computer-implemented method of claim 3, wherein presenting the plurality of solution variants in the graphical user interface comprises:

presenting, in the graphical user interface, a first graph associated with the first key performance indicator, wherein each solution variant from the plurality of solution variants is associated with a first point on the first graph; and presenting, in the graphical user interface, a second graph associated with a second key performance indicator, wherein each solution variant from the plurality of solution variants is associated with a second point on the second graph.

7. A system comprising:

a data storage medium comprising a database, wherein the database comprises a plurality of hardware components; and one or more computer hardware processors in communication with the data storage medium, wherein the one or more computer hardware processors are configured to execute computer-executable instructions to at least:

receive a design specification, the design specification comprising a plurality of blocks and a first connection, wherein the first connection connects a first block and a second block;

determine a set of ranges for a key performance indicator, the set of ranges comprising a first range and a second range;

generate a plurality of solution variants based on the design specification, wherein generating the plurality of solution variants comprises:

for each range of the set of ranges, for each block of the plurality of blocks, determine query parameters based on the block, execute a query of the database with the query parameters, receive, from the database, a plurality of results responsive to the query, wherein each result of the plurality of results is associated with a hardware component, apply an artificial intelligence algorithm to one or more hardware components from the plurality of results and the range, wherein the artificial intelligence algorithm outputs an inference, and select, from the plurality of results, a hardware component based on the inference; and present the plurality of solution variants in a graphical user interface.

8. The system of claim 7, wherein the one or more computer hardware processors are configured to execute further computer-executable instructions to at least:

determine a first key performance indicator associated with a first solution variant of the plurality of solution variants, wherein presenting the plurality of solution variants comprises:

presenting the first key performance indicator in the graphical user interface.

9. The system of claim 8, wherein the first key performance indicator comprises at least one of an estimated project cost, area, component availability, maturity, or reliability.

10. The system of claim 8, wherein determining the first key performance indicator comprises:

determining that an area rule applies to the first solution variant; and calculating the first key performance indicator, wherein calculating the first key performance indicator comprises:

applying a first coefficient to an initial area of the first solution variant.

11. The system of claim 8, wherein determining the first key performance indicator comprises:

applying a machine learning model based on the first solution variant, wherein the machine learning model outputs a model result; and calculating the first key performance indicator based on the model result.

12. The system of claim 11, wherein the one or more computer hardware processors are configured to execute additional computer-executable instructions to at least:

determine training data comprising a plurality of solutions and a label for each solution from the plurality of solutions; and train the machine learning model using the training data, wherein training the machined learning model comprises adjusting a weight of the machine learning model based on labels associated with the plurality of solutions.

13. The system of claim 7, wherein applying the artificial intelligence algorithm to the one or more hardware components further comprises:

executing a simulated annealing algorithm on the one or more hardware components, wherein the simulated annealing algorithm generates a candidate solution as the inference.

14. A system comprising:

a data storage medium comprising a database, wherein the database comprises a plurality of hardware components; and one or more computer hardware processors in communication with the data storage medium, wherein the one or more computer hardware processors are configured to execute computer-executable instructions to at least:

receive a design specification, the design specification comprising a plurality of blocks and a first connection, wherein the first connection connects a first block and a second block;

determine a plurality of input seeds;

generate a plurality of solution variants based on the design specification, wherein generating the plurality of solution variants comprises:

for each input seed of the plurality of input seeds, for each block of the plurality of blocks, determine query parameters based on the block, executing a query of the database with the query parameters, receive, from the database, a plurality of results responsive to the query, wherein each result of the plurality of results is associated with a hardware component, apply an artificial intelligence algorithm to one or more hardware components from the plurality of results and the input seed, wherein the artificial intelligence algorithm outputs an inference, and select, from the plurality of results, a hardware component based on the inference; and present the plurality of solution variants in a graphical user interface.

15. The system of claim 14, wherein the one or more computer hardware processors are configured to execute further computer-executable instructions to at least:

determine a first key performance indicator associated with a first solution variant of the plurality of solution variants, wherein presenting the plurality of solution variants comprises:

presenting the first key performance indicator in the graphical user interface.

16. The system of claim 15, wherein determining the first key performance indicator comprises:

combining a cost for each hardware component of the first solution variant into a total cost, wherein the first key performance indicator comprises the total cost.

17. The system of claim 15, wherein determining the first key performance indicator comprises:

determining an estimated level of availability for each hardware component of the first solution variant; and determining a combined level of availability from each estimated level of availability, wherein the first key performance indicator comprises the combined level of availability.

18. The system of claim 15, wherein determining the first key performance indicator comprises:

determining an estimated level of reliability for each hardware component of the first solution variant; and determining a combined level of reliability from each estimated level of reliability, wherein the first key performance indicator comprises the combined level of reliability.

19. The system of claim 14, wherein determining the plurality of input seeds comprises:

pseudo-randomly generating a first number, wherein a first input seed of the plurality of input seeds comprises the first number.

20. The system of claim 19, wherein applying the artificial intelligence algorithm to the one or more hardware components further comprises:

executing a simulated annealing algorithm on the one or more hardware components using the first number, wherein the simulated annealing algorithm generates a candidate solution as the inference.

* * * * *